(12) United States Patent
Frayer et al.

(10) Patent No.: US 9,613,715 B2
(45) Date of Patent: *Apr. 4, 2017

(54) LOW-TEST MEMORY STACK FOR NON-VOLATILE STORAGE

(71) Applicant: SanDisk Technologies LLC, Dallas, TX (US)

(72) Inventors: Jack Edward Frayer, Boulder Creek, CA (US); Vidyabhushan Mohan, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/642,611

(22) Filed: Mar. 9, 2015

(65) Prior Publication Data

US 2015/0364215 A1 Dec. 17, 2015

Related U.S. Application Data

(63) Continuation-in-part of application No. 14/311,143, filed on Jun. 20, 2014, now Pat. No. 8,976,609.

(Continued)

(51) Int. Cl.
*G11C 7/00* (2006.01)
*G11C 29/00* (2006.01)
(Continued)

(52) U.S. Cl.
CPC .......... *G11C 29/08* (2013.01); *G11C 29/006* (2013.01); *G11C 29/04* (2013.01); *G11C 29/10* (2013.01);
(Continued)

(58) Field of Classification Search
CPC ....... G11C 29/08; G11C 29/006; G11C 29/04; G11C 29/10; G11C 29/44; H01L 25/50; H01L 25/0675
(Continued)

(56) References Cited

U.S. PATENT DOCUMENTS 5,254,482 A 10/1993 Fisch
5,734,816 A 3/1998 Niijima et al.
(Continued)

FOREIGN PATENT DOCUMENTS

EP 1139414 10/2001

OTHER PUBLICATIONS

International Search Report and Written Opinion dated Nov. 2, 2015, received in International Application No. PCT/US2015/033909, which corresponds to U.S. Appl. No. 14/311,143, 18 pages (Frayer).

(Continued)

*Primary Examiner* — Toan Le
(74) *Attorney, Agent, or Firm* — Morgan, Lewis & Bockius LLP

(57) ABSTRACT

The various embodiments described herein include systems, methods and/or devices used to package non-volatile memory. In one aspect, the method includes: (1) selecting, from a set of non-volatile memory die, a plurality of non-volatile memory die on which one or more tests have been deferred until after packaging, the selecting in accordance with wafer positions of the plurality of non-volatile memory die and statistical die performance information corresponding to the wafer positions; and (2) packaging the selected plurality of non-volatile memory die. In some embodiments, after said packaging, the method further includes performing a set of tests on the plurality of non-volatile memory die to identify respective units of memory (Continued)

within the plurality of non-volatile memory die that meet predefined validity criteria, wherein the set of tests performed include at least one of the deferred one or more tests.

16 Claims, 16 Drawing Sheets

Related U.S. Application Data

(60) Provisional application No. 62/012,918, filed on Jun. 16, 2014.

(51) Int. Cl.

| | | |
|---|---|---|
| *G11C 29/08* | (2006.01) | |
| *H01L 25/00* | (2006.01) | |
| *H01L 25/065* | (2006.01) | |
| *G11C 29/10* | (2006.01) | |
| *G11C 29/44* | (2006.01) | |
| *G11C 29/04* | (2006.01) | |
| *G11C 16/00* | (2006.01) | |

(52) U.S. Cl.
CPC .......... *G11C 29/44* (2013.01); *H01L 25/0657* (2013.01); *H01L 25/50* (2013.01); *G11C 16/00* (2013.01); *G11C 2029/0403* (2013.01); *H01L 2924/0002* (2013.01)

(58) Field of Classification Search
USPC .................. 365/201; 324/754.01; 714/25
See application file for complete search history.

(56) References Cited

U.S. PATENT DOCUMENTS

| | | | |
|---|---|---|---|
| 5,930,504 | A | 7/1999 | Gabel |
| 5,963,983 | A | 10/1999 | Sakakura et al. |
| 6,069,827 | A | 5/2000 | Sinclair |
| 6,148,354 | A | 11/2000 | Ban et al. |
| 6,412,080 | B1 | 6/2002 | Fleming et al. |
| 6,854,070 | B2 | 2/2005 | Johnson et al. |
| 7,107,389 | B2 | 9/2006 | Inagaki et al. |
| 7,139,864 | B2 | 11/2006 | Bennett et al. |
| 7,330,927 | B1 | 2/2008 | Reeve et al. |
| 7,609,561 | B2 | 10/2009 | Cornwell et al. |
| 7,949,931 | B2 | 5/2011 | Lastras-Montano |
| 8,122,319 | B2 | 2/2012 | Peddle |
| 8,291,295 | B2 | 10/2012 | Harari et al. |
| 8,443,263 | B2 | 5/2013 | Selinger et al. |
| 8,707,104 | B1 | 4/2014 | Jean |
| 8,976,609 | B1* | 3/2015 | Frayer .................. G11C 29/006 324/754.01 |
| 2003/0076125 | A1 | 4/2003 | McCord |
| 2003/0115564 | A1 | 6/2003 | Chang et al. |
| 2003/0163633 | A1 | 8/2003 | Aasheim et al. |
| 2005/0021904 | A1 | 1/2005 | Iaculo et al. |
| 2005/0038792 | A1 | 2/2005 | Johnson |
| 2005/0047229 | A1 | 3/2005 | Nadeau-Dostie et al. |
| 2006/0020745 | A1 | 1/2006 | Conley et al. |
| 2006/0069852 | A1 | 3/2006 | Aasheim et al. |
| 2006/0101219 | A1 | 5/2006 | Mita et al. |
| 2006/0106749 | A1 | 5/2006 | Ganfield et al. |
| 2006/0136682 | A1 | 6/2006 | Haridas et al. |
| 2006/0143365 | A1 | 6/2006 | Kikuchi |
| 2006/0168488 | A1 | 7/2006 | Hill et al. |
| 2006/0179378 | A1 | 8/2006 | Iida et al. |
| 2006/0224823 | A1 | 10/2006 | Morley et al. |
| 2006/0256624 | A1 | 11/2006 | Eggleston et al. |
| 2006/0282644 | A1 | 12/2006 | Wong |
| 2007/0005928 | A1 | 1/2007 | Trika et al. |
| 2007/0033374 | A1 | 2/2007 | Sinclair et al. |
| 2007/0198796 | A1 | 8/2007 | Warren, Jr. |
| 2007/0234004 | A1 | 10/2007 | Oshima et al. |
| 2007/0263449 | A1 | 11/2007 | Yu et al. |
| 2007/0276973 | A1 | 11/2007 | Tan et al. |
| 2007/0283428 | A1 | 12/2007 | Ma et al. |
| 2008/0046630 | A1 | 2/2008 | Lasser |
| 2008/0046802 | A1 | 2/2008 | Honda |
| 2008/0077762 | A1 | 3/2008 | Scott et al. |
| 2008/0133832 | A1 | 6/2008 | Bhavnani |
| 2008/0195822 | A1 | 8/2008 | Yang et al. |
| 2009/0125670 | A1 | 5/2009 | Keays |
| 2009/0164702 | A1 | 6/2009 | Kern |
| 2010/0017650 | A1 | 1/2010 | Chin et al. |
| 2010/0023674 | A1 | 1/2010 | Aviles |
| 2010/0070686 | A1 | 3/2010 | Mergler et al. |
| 2010/0077136 | A1 | 3/2010 | Ware et al. |
| 2010/0141286 | A1 | 6/2010 | Varadarajan et al. |
| 2010/0217915 | A1 | 8/2010 | O'Connor et al. |
| 2010/0293367 | A1 | 11/2010 | Berke et al. |
| 2010/0296353 | A1 | 11/2010 | Hong et al. |
| 2011/0035540 | A1 | 2/2011 | Fitzgerald et al. |
| 2014/0029355 | A1 | 1/2014 | Choi et al. |

OTHER PUBLICATIONS

International Search Report and Written Opinion dated Oct. 2, 2015, received in International Application No. PCT/US2015/039789, which corresponds to U.S. Appl. No. 14/596,177, 12 pages (Creasman).

* cited by examiner

600

---

602: For each respective unit of memory of a sequence of two or more units of memory in a plurality of physical die of non-volatile memory, each unit of memory being addressable by a respective first address, determine a validity state of the respective unit of memory.

The validity state is one of a valid state and an invalid state.

604: For a respective unit of memory, the validity state is based on as-manufactured characteristics of the respective unit of memory

606: Each respective unit of memory comprises a plurality of sub-units of memory.

Determining a validity state of a respective unit of memory includes determining whether a predefined number of the plurality of sub-units of memory are writable.

---

608: In accordance with a determination that the validity state of the respective unit of memory is the invalid state: store, in a table, a second address assigned to the respective unit of memory.

At least a portion of the second address is a physical address portion corresponding to a physical location of a second unit of memory that is distinct from the respective unit of memory.

610: Designate one or more units of memory of the plurality of physical die as reserve units of memory

612: Assign each second address from among the one or more units of memory designated as reserve units of memory

614: The non-volatile memory module is configured to concurrently perform N parallel read/write operations, where N is an integer greater than 2.

For each respective unit of memory determined to be in the invalid state, the respective second address is an address that preserves the non-volatile memory module's ability to perform N parallel read/write operations.

616: The table is a sparse table storing respective second addresses for only the units of memory that have an invalid state.

LOW-TEST MEMORY STACK FOR NON-VOLATILE STORAGE

RELATED APPLICATION

This application is a continuation-in-part of U.S. patent application Ser. No. 14/311,143, filed Jun. 20, 2014, now U.S. Pat. No. 8,976,609, which claims priority to U.S. Provisional Application Ser. No. 62/012,918, filed Jun. 16, 2014, each of which is herein incorporated by reference in its entirety.

This application is also related to U.S. patent application Ser. No. 14/597,169 filed Jan. 15, 2015, "Non-Volatile Memory Module with Physical-To-Physical Address Remapping," which claimed priority to U.S. Provisional Patent Application No. 62/012,918, filed Jun. 16, 2014, and U.S. Provisional Patent Application No. 62/020,307, filed Jul. 2, 2014, all of which are hereby incorporated by reference in their entirety.

TECHNICAL FIELD

The disclosed embodiments relate generally to memory systems, and in particular, relate to low-test memory stacks for non-volatile storage.

BACKGROUND

Semiconductor memory devices, including flash memory, typically utilize memory cells to store data as an electrical value, such as an electrical charge or voltage. A flash memory cell, for example, includes a single transistor with a floating gate that is used to store a charge representative of a data value. Flash memory is a non-volatile data memory device that can be electrically erased and reprogrammed. More generally, non-volatile memory (e.g., flash memory, as well as other types of non-volatile memory implemented using any of a variety of technologies) retains stored information even when not powered, as opposed to volatile memory, which requires power to maintain the stored information.

Conventional manufacturing workflows utilize extensive testing to produce high-quality memory devices and/or memory components (e.g., components of memory devices). This testing often represents a large portion of the cost of production. In addition, extensive testing may also place a substantial amount of wear on a memory device even before it reaches the consumer. For example, flash memory devices typically have a viable lifetime expressed as a number of program/erase (P/E) cycles that can be performed before the flash memory becomes unreliable. Certain tests performed in conventional manufacturing workflows require a significant number of P/E cycles to be performed on the flash memory, thereby reducing its remaining lifetime available to the consumer.

SUMMARY

Various implementations of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various implementations are used to select and package non-volatile memory prior to performing at least some testing. In various implementations, the non-volatile memory is a component in a storage system and/or is external to and coupled with a storage controller.

In one aspect, a plurality of non-volatile memory die are selected and packaged prior to performing one or more tests (e.g., certain die-level and sub-die-level tests). In some embodiments, after packaging, a set of tests are performed on the plurality of non-volatile memory die to identify respective units of memory within the non-volatile memory die that meet predefined validity criteria. In doing so, the cost of testing and packaging of non-volatile memory is mitigated, as explained in greater detail below.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

FIGS. 6A-6C illustrate a flowchart representation of a method for physical-to-physical address remapping, in accordance with some embodiments.

Figure 1A:
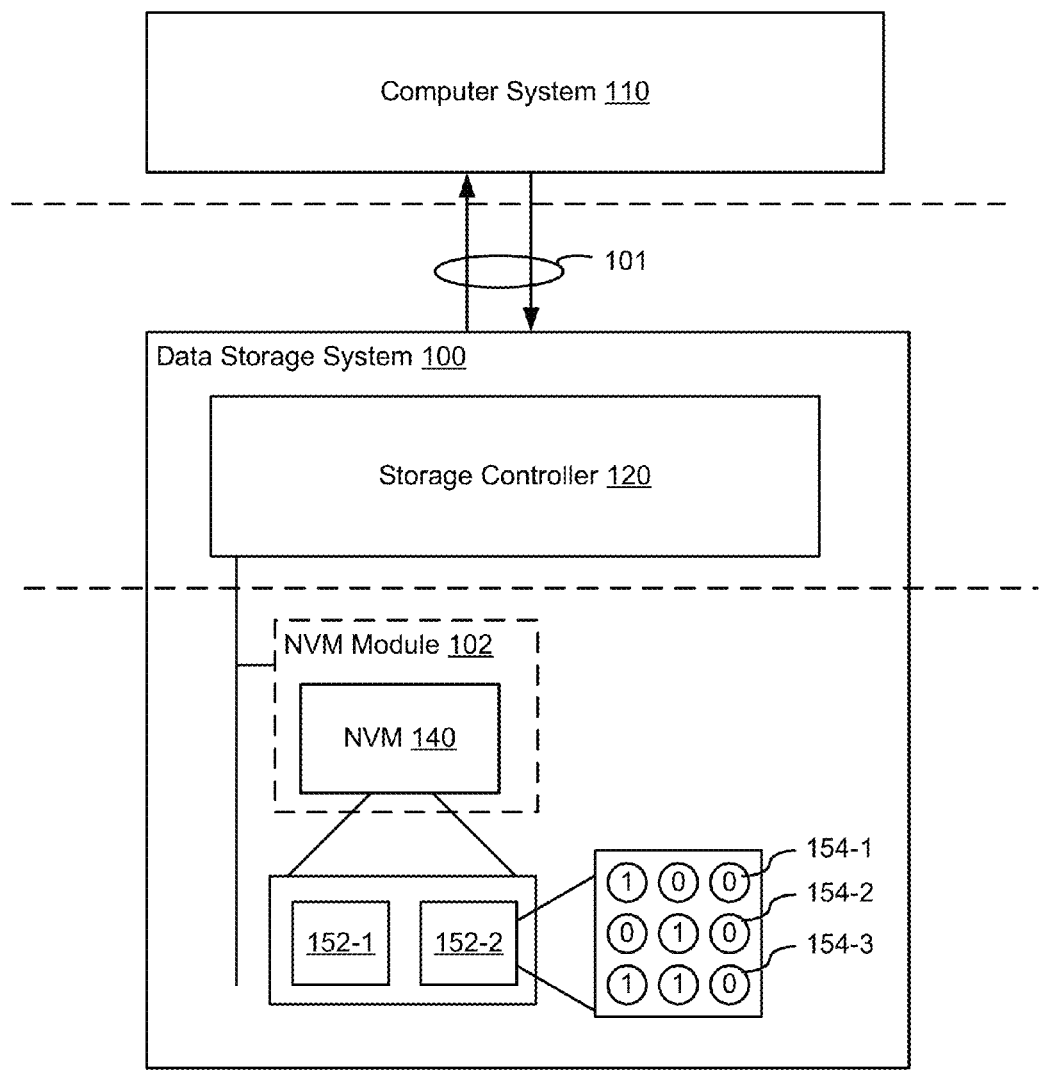
FIG. 1A is a block diagram illustrating an implementation of a data storage environment, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

Regardless of what type of memory elements (e.g., individual memory cells within a memory die) are used in a storage system, or how such memory elements are configured (e.g., a 2D configuration, a 3D configuration), memory elements sometimes fail for a variety of reasons. Manufacturing processes for such memory elements have a certain yield, meaning that some as-manufactured memory elements are likely to be "bad" from the start. Other memory elements are, as-manufactured, severely compromised. In conventional processes, an extensive amount of testing is performed to bin memory die (e.g., NVM die 140, FIG. 1A) into different grades (e.g., based on the fraction of working, or functional, memory elements within such memory die) prior to incorporating the memory die into a larger memory device (e.g., memory module 102, FIG. 1A). For example, memory elements that are, as-manufactured, severely compromised often fail a so-called "burn-in" test, resulting in portions of memory die (e.g., pages, blocks, die planes) that are unusable. These portions of memory die are typically ignored once the memory die is incorporated into a storage system. When a memory die includes a large number of unusable portions, the result is a lower grade for the memory die. Low-grade memory die are sometimes packaged together to produce cheaper, so-called "remnant," memory device.

But this extensive testing adds a significant cost to producing high-grade memory devices (e.g., memory devices made using high-grade memory die). This cost is often not offset by the selling of remnant-grade memory device (e.g., high-grade memory modules). For example, in some circumstances, the cost of testing is upward of 32% of the cost of producing high-grade memory devices. In contrast, the selling of remnant-grade memory devices typically returns a much smaller fraction of the cost of producing high-grade memory devices (e.g., on the order of 4%). Thus, in some circumstances, the production of high-grade memory devices essentially subsidizes the production of remnant-grade memory devices, which increases the cost of high-grade memory devices for the consumer.

In addition, memory elements undergo a large number of program/erase (P/E) cycles during such extensive testing. For types of memory with a finite lifetime of P/E cycles (e.g., flash memory), a substantial portion of their lifetimes can be expended just during product testing.

The various implementations described herein include systems, methods and/or devices that reduce the amount of testing that memory elements undergo before being packaged into a memory module, thus lowering the cost and preserving the lifetime of the memory elements. To this end, some implementations described herein provide deferral of certain die-level and sub-die-level tests until after non-volatile memory die are packaged into a memory device.

More specifically, some embodiments include a method of packaging non-volatile memory. In some embodiments, the method includes selecting, from a set of non-volatile memory die, a plurality of non-volatile memory die on which predefined die-level and sub-die-level tests have been deferred until after packaging, in accordance with predefined criteria and predefined statistical die performance information corresponding to the set of non-volatile memory die. The method further includes packaging the selected plurality of non-volatile memory die into a memory device. The method still further includes, after said packaging, performing a set of tests on the plurality of non-volatile memory die in the memory device to identify respective units of memory within the non-volatile memory die in the memory device that meet predefined validity criteria. The set of tests performed include the deferred predefined die-level and sub-die-level tests.

In some embodiments, the selecting includes selecting the plurality of non-volatile memory die in accordance with wafer positions of the plurality of non-volatile memory die. In some embodiments, the selecting includes selecting the plurality of non-volatile memory die in accordance with wafer positions of the plurality of non-volatile memory die and statistical die performance information corresponding to the wafer positions.

In some embodiments, the method further includes deferring, at least until the selected plurality of non-volatile memory die are packaged into the memory device, or forgoing entirely, performance of at least one of the following tests: a wafer sort test, a memory component test, a known good die test, and a burn-in test.

In some embodiments, the selecting includes, in accordance with the predefined statistical die performance information, selecting a number of die so as to over-provision the memory device to guarantee, within a predefined statistical tolerance, a minimum amount of programmable/erasable memory in the memory device.

In some embodiments, the method further includes, after packaging the plurality of non-volatile memory die into the memory device, determining an amount of programmable/erasable memory in the memory device.

In some embodiments, the method further includes, after packaging the plurality of non-volatile memory die into the memory device, during initialization of the memory device, performing an initialization procedure that includes determining a validity state of one or more units of memory of the plurality of non-volatile memory die. The validity state is one of a valid state or an invalid state. The method still further includes using physical-to-physical address remapping to redirect a read/write request addressed to a respective unit of memory having an invalid state to a unit of memory having a valid state.

In some embodiments, determining a validity state of the one or more units of memory includes determining a validity metric of the one or more units of memory, and comparing the validity metric to a predefined threshold to determine the validity state of the one or more units of memory. In some embodiments, the validity metric is a bit error rate (BER) of the one or more units of memory during initialization.

In some embodiments, the method further includes writing to the plurality of non-volatile memory die in accordance with a wear leveling algorithm that accounts for the validity metric determined during initialization.

In some embodiments, the set of non-volatile memory die comprises flash memory.

In some embodiments, a median number of program/erase (P/E) cycles performed on units of memory of the plurality of non-volatile memory die prior to the packaging is less than fifty P/E cycles.

In another aspect, some implementations provide a non-volatile memory module. The non-volatile memory module includes a plurality of non-volatile memory die selected, packaged, and tested in accordance with any of the methods provided herein.

In another aspect, some implementations provide a storage system. The storage system includes an interface for operatively coupling the storage system with a host system and a plurality of non-volatile memory die selected, packaged, and tested in accordance with any of the methods provided herein.

The various implementations described herein include systems, methods and/or devices that reduce the amount of testing that memory elements undergo before being packaged (e.g., into a memory module), thus lowering the cost and preserving the lifetime of the memory elements. To this end, some implementations described herein provide deferral of certain tests (e.g., die-level and sub-die-level tests) until after non-volatile memory die are packaged.

(C1) More specifically, some embodiments include a method of packaging non-volatile memory. In some embodiments, the method includes: (1) selecting, from a set of non-volatile memory die, a plurality of non-volatile memory die on which one or more tests have been deferred until after packaging, the selecting in accordance with wafer positions of the plurality of non-volatile memory die and statistical die performance information corresponding to the wafer positions, and (2) packaging the selected plurality of non-volatile memory die.

(C2) In some embodiments of the method of C1, the selecting includes, in accordance with the statistical die performance information, selecting a number of die so as to over-provision the packaged non-volatile memory to guarantee, within a predefined statistical tolerance, at least a predefined amount of programmable/erasable memory in the packaged non-volatile memory.

(C3) In some embodiments of the method of any of C1 to C2, the method further includes, after said packaging, performing a set of tests on the plurality of non-volatile memory die to identify respective units of memory within the plurality of non-volatile memory die that meet predefined validity criteria, wherein the set of tests performed include at least one of the deferred one or more tests.

(C4) In some embodiments of the method of C3, at least one test of the set of tests is performed by a host system under control of system application software.

(C5) In some embodiments of the method of any of C1 to C4, the one or more tests that have been deferred until after packaging include at least one predefined die-level test.

(C6) In some embodiments of the method of any of C1 to C5, the one or more tests that have been deferred until after packaging include at least one predefined sub-die-level test.

(C7) In some embodiments of the method of any of C1 to C6, the method further includes deferring, at least until the selected plurality of non-volatile memory die are packaged, performance of at least one of the following tests: a wafer sort test, a known good die test, and a burn-in test.

(C8) In some embodiments of the method of any of C1 to C7, the method further includes forgoing performance of at least one of the following tests: a wafer sort test, a memory component test, a known good die test, and a burn-in test.

(C9) In some embodiments of the method of any of C1 to C8, the method further includes after packaging the plurality of non-volatile memory die, determining an amount of programmable/erasable memory in the packaged non-volatile memory.

(C10) In some embodiments of the method of any of C1 to C9, the method further includes, after packaging the plurality of non-volatile memory die, during initialization of the packaged non-volatile memory, performing an initialization procedure that includes: (1) determining a validity state of one or more units of memory of the plurality of non-volatile memory die, the validity state being one of a valid state or an invalid state, and (2) using physical-to-physical address remapping to redirect a read/write request addressed to a respective unit of memory having an invalid state to a unit of memory having a valid state.

(C11) In some embodiments of the method of C10, determining the validity state of the one or more units of memory includes: (1) determining a validity metric of the one or more units of memory, and (2) comparing the validity metric to a predefined threshold to determine the validity state of the one or more units of memory.

(C12) In some embodiments of the method of C11, the validity metric is a bit error rate (BER) of the one or more units of memory during initialization.

(C13) In some embodiments of the method of any of C11 to C12, the method further includes writing to the plurality of non-volatile memory die in accordance with a wear leveling algorithm that accounts for the validity metric determined during initialization.

(C14) In some embodiments of the method of any of C1 to C13, the set of non-volatile memory die comprises flash memory.

(C15) In some embodiments of the method of any of C1 to C14, a median number of program/erase (P/E) cycles performed on units of memory of the plurality of non-volatile memory die prior to the packaging is less than fifty P/E cycles.

(C16) In another aspect, a storage system includes (1) an interface for operatively coupling the storage system with a host system, and (2) a plurality of non-volatile memory die selected and packaged in accordance with the method of any of C1 to C15.

In yet another aspect, some implementations provide a non-volatile memory module. The non-volatile memory module includes a plurality of non-volatile memory die selected and packaged in accordance with the method of any of C1 to C15.

Numerous details are described herein in order to provide a thorough understanding of the example implementations illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the implementations described herein.

As used herein, the term "memory device" should be construed to mean any electronic device that includes memory. For example, a portion of a processed wafer (called a "die") having memory elements and at least one electrode is a memory device. An enterprise-level storage system having a storage controller and a plurality of plug-in (e.g., DIMM) memory modules is also a memory device. Each memory module is also a memory device. More particularly, a "storage system" or "data storage system" is a memory device that includes memory and a storage controller. A "memory module" is a memory device that includes memory and packaging, and optionally supporting circuitry (e.g., electrodes that form a data bus). In some embodiments, memory modules are separate from and configured to be coupled to a storage controller (as described below), and are therefore indirectly (e.g., by way of the storage controller) coupled to a host computer. Despite optionally not including a storage controller, in some embodiments, a memory module includes a circuit (e.g., an application specific integrated circuit) that performs some tasks that are conventionally performed by a storage controller (e.g., partial logical-to-physical address mapping, as described below). A memory module can include other memory modules as components or sub-systems. For example, a DIMM memory module may include a plurality of memory chips (e.g., 8 memory chips). The memory chips (e.g., integrated circuit chips, sometimes called "microchips") should also be considered memory modules as long as they include memory and packaging. The term "component" is used to mean a constituent part. For example, a memory component is a constituent part of a memory device.

FIG. 1A is a block diagram illustrating an implementation of a data storage environment 158, in accordance with some embodiments. FIG. 1A is not intended to be limiting, but is rather intended illustrate a hierarchical taxonomy of terms that are used herein, in accordance with some embodiments. Many of the components described with reference to FIG. 1A are described in greater detail elsewhere in this document, for example, with reference to FIG. 1B or with reference to the description of semiconductor memory above. To that end, data storage environment 158 includes computer system 110 (sometimes called a "host") that issues host commands (e.g., read/write/erase commands) and data storage system 100. Data storage system 100 includes storage controller 120 and one or more non-volatile memory (NVM) die 140.

In some embodiments, storage controller 120 is packaged with the one or more NVM die 140, in which case the combination is sometimes referred to as a storage system. Alternatively, in some embodiments, the one or more NVM die 140 are packaged into one or more NVM modules 102 and are separate from storage controller 120.

In some embodiments, each NVM die 140 includes one or more die planes 152 that each have their own circuitry (e.g., sense amplifiers and the like) to support memory operations (e.g., read/write/erase processes that are the result of host commands from computer system 110, or that are the result of internal processes that migrate data from one memory location to another). Die planes 152 therefore comprise circuitry to carry out host commands (not shown in FIG. 1A) as well as memory elements 154 (e.g., memory elements 154-1 through 154-3). In some embodiments, the memory elements are organized into pages (e.g., a page of 2212 eight-bit bytes, where each bit is a value stored in an individual memory element 154). In some embodiments, a page corresponds to a word line (or a portion of a word line) on a die plane. In some embodiments, pages are organized into blocks (e.g., a block is 64 pages), and there are a fixed number of blocks per die plane (e.g., 8224 blocks). In some embodiments, memory elements 154 are flash memory elements configured to store data in accordance with a predefined or specified storage density, such as X3 (i.e., 3 bits per memory cell), X2 (i.e., 2 bits per memory cell), or X1 (i.e., 1 bit per memory cell).

Figure 1B:
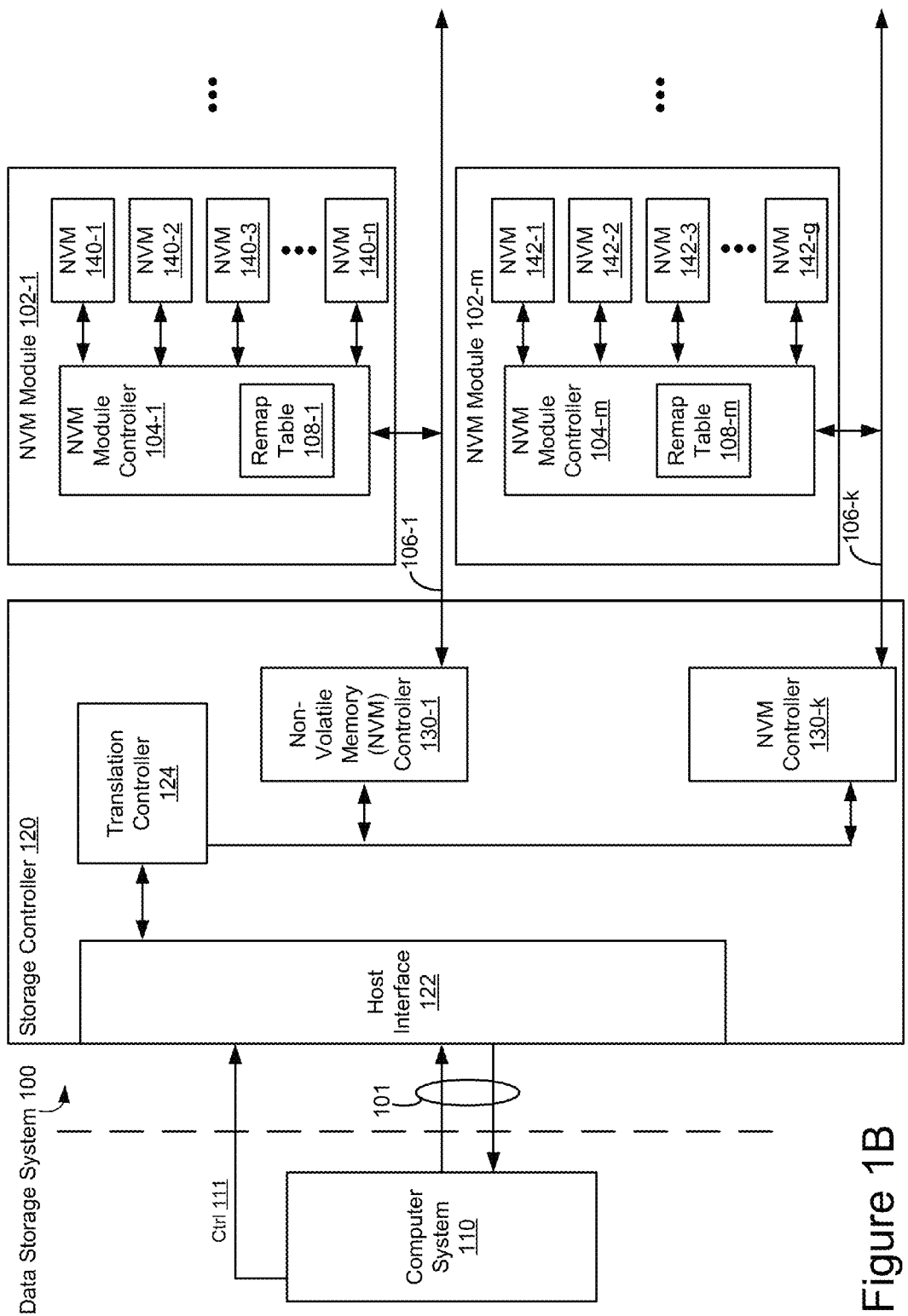
FIG. 1B is a block diagram illustrating an implementation of a data storage system, in accordance with some embodiments.

FIG. 1B is a block diagram illustrating an implementation of a data storage system 100, in accordance with some embodiments. While some example features are illustrated, various other features have not been illustrated for the sake of brevity and so as not to obscure more pertinent aspects of the example implementations disclosed herein. To that end, as a non-limiting example, data storage system 100 is used in conjunction with a computer system 110. Data storage system 100 includes storage controller 120, which includes host interface 122, translation controller 124, one or more non-volatile memory (NVM) controllers 130 (e.g., NVM controller 130-1 through NVM controller 130-k), and non-volatile memory (NVM) modules 102 (e.g., NVM module 102-1 through NVM module 102-m). In some embodiments, storage controller 120 includes additional modules, not shown, that perform a variety of tasks. For example, in some embodiments, storage controller 120 includes module(s) for endurance management, RAID (redundant array of independent drive) management, compression, error correction encoding/decoding, encryption, and/or wear leveling, as well as additional modules.

Non-volatile memory module(s) 102 are coupled with the storage controller 120 via one or more memory channel(s) 106 (e.g., memory channels 106-1 through 106-k). For example, as depicted in FIG. 1B, each respective channel 106 supports one or more NVM modules 102 and is coupled with a respective NVM controller 130, sometimes called a memory channel controller. In some embodiments, each respective memory channel 106 includes one or more data buses (e.g., eight data buses).

Non-volatile memory module(s) 102 include one or more NVM die 140/142. Non-volatile memory module(s) 102 also include NVM module controller 104 with remap table 108. Remap table 108 stores physical-to-physical address mappings for units of memory (e.g., portions or segments of memory, such as pages, blocks, die planes, banks, or die) within NVM die 140/142, as described in greater detail below.

Computer system 110 is coupled with storage controller 120 through data connections 101. However, in some embodiments, computer system 110 includes storage controller 120 as a component and/or sub-system. Likewise, in some embodiments, computer system 110 includes NVM modules 102 as components or sub-systems. Computer system 110 may be any suitable computing device, such as a personal computer, a workstation, a computer server, or any other computing device. Computer system 110 is sometimes called a host or host system. In some embodiments, computer system 110 includes one or more processors, one or more types of memory, optionally includes a display and/or other user interface components such as a keyboard, a touch screen display, a mouse, a track-pad, a digital camera and/or any number of supplemental devices to add functionality. Further, in some embodiments, computer system 110 sends one or more host commands (e.g., read commands and/or write commands) on control line 111 to storage controller 120. In some embodiments, computer system 110 is a server system, such as a server system in a data center, and does not have a display and other user interface components.

In some embodiments, storage controller 120 is coupled with a single NVM module 102 (e.g., via a single channel 106) while in other embodiments storage controller 120 is coupled with a plurality of NVM modules 102 (e.g., via one or more memory channels 106). In some embodiments, not shown in FIG. 1B, storage controller 120 includes NVM modules 102 as components or sub-systems, in which case storage controller 120 is referred to more generally as a storage system.

In various embodiments, NVM die 140/142 include NAND-type flash memory or NOR-type flash memory. More generally, NVM die 140/142 include any of the types of the non-volatile semiconductor memory devices described in this document, arranged in any of the arrangements described herein. Further, in some embodiments, NVM controllers 130 are solid-state drive (SSD) controllers. However, one or more other types of storage media may be included in accordance with aspects of a wide variety of implementations. In some embodiments, NVM modules 102 are or include dual in-line memory module (DIMM) devices. In some embodiments, NVM modules 102 are compatible with DIMM memory slots. For example, in some embodiments, NVM modules 102 are compatible with 240-pin DIMM memory slots. In other embodiments, NVM modules 102 are or include flip-chip modules that are electrically coupled with channels 106 by solder bumps. In some embodiments, NVM modules 102 are compatible with signaling in accordance with a DDR3 interface specification.

In some embodiments, NVM modules 102 are compatible with signaling in accordance with the SATA (serial advance technology attachment) interface specification, while in yet other embodiments NVM modules 102 are compatible with signaling in accordance with the SAS (serial attached SCSI) interface specification.

Figure 2A:
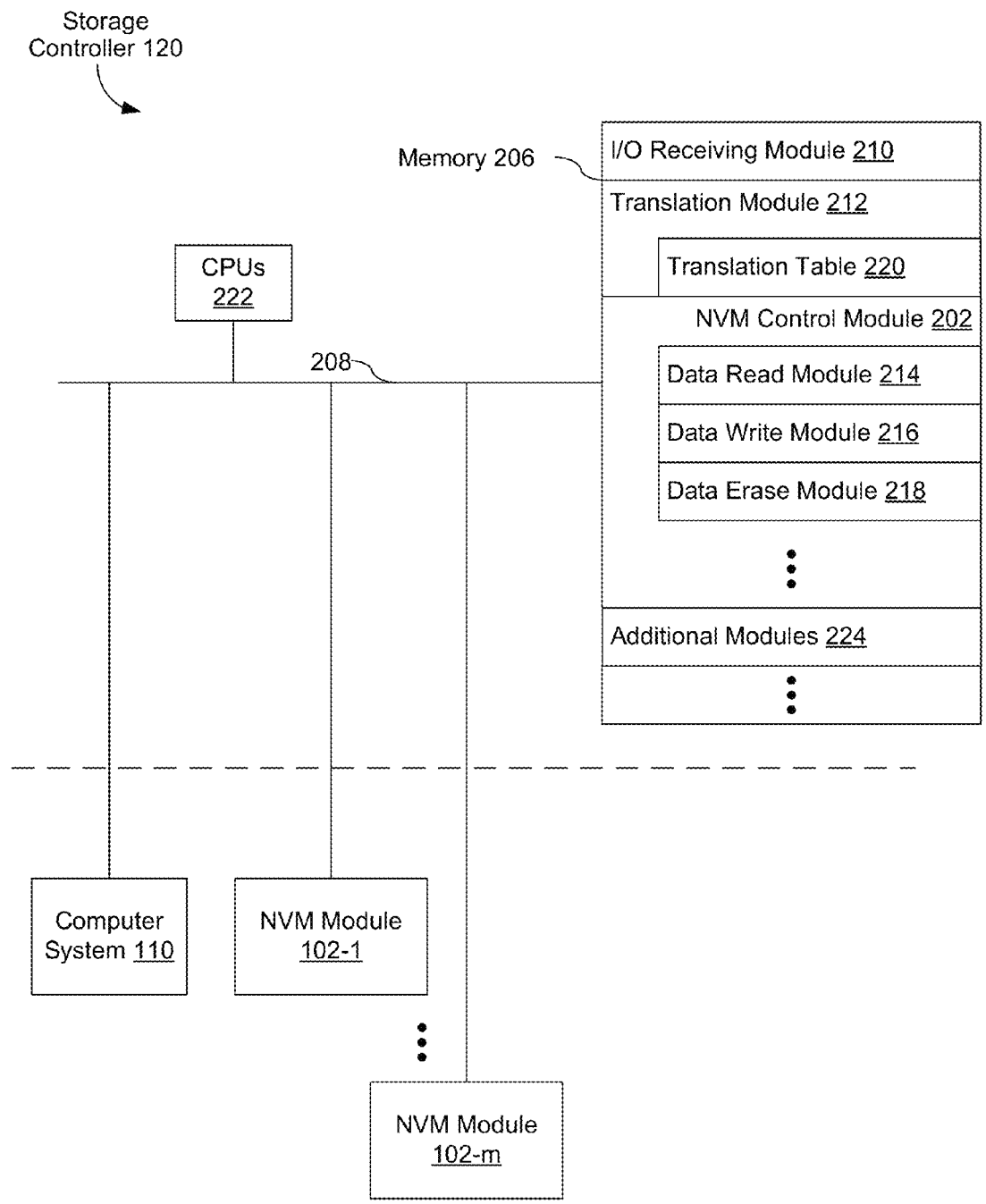
FIG. 2A is a block diagram illustrating an exemplary storage controller, in accordance with some embodiments.

In some embodiments, each NVM controller of NVM controllers 130 includes one or more processing units (sometimes called CPUs or processors or microprocessors or microcontrollers) configured to execute instructions in one or more programs (e.g., in NVM control module 202, FIG. 2A). Channels 106 that couple NVM controllers 130 and NVM modules 102 are connections that typically convey commands in addition to data, and, optionally, convey metadata, error correction information and/or other information in addition to data values to be stored in NVM die 140/142 and data values read from NVM die 140/142. To that end, in some embodiments, channels 106 are or include one or more data buses (e.g., eight data buses).

In some embodiments, storage device 120 is configured for enterprise storage suitable for applications such as cloud computing, or for caching data stored (or to be stored) in secondary storage, such as hard disk drives. In some other embodiments, storage device 120 is configured for relatively smaller-scale applications such as personal flash drives or hard-disk replacements for personal, laptop and tablet computers. Although flash memory devices and flash controllers are used as an example here, in some embodiments storage device 120 includes other non-volatile memory device(s) and corresponding non-volatile storage controller(s).

In some embodiments, translation controller 124 receives host commands (e.g., read/write/erase commands) from computer system 110 (e.g., via control line 111 by way of host interface 124). The host commands include one or more logical block addresses (LBAs) that specify (e.g., in a logical address space) the memory to which the host command is applicable. In some embodiments, translation controller 124 manages the host commands by mapping the LBAs to physical addresses in a physical address space (e.g., by performing a physical address look-up or assignment in translation table 212, FIG. 2). In some embodiments, translation controller 124 communicates the physical addresses to the appropriate NVM controller(s) 130, which facilitates execution of the host commands (e.g., executing data read, data write, and/or block erase commands).

Alternatively, in some embodiments, translation controller 124 manages host commands by mapping the LBAs to partial physical addresses. In some implementations, a partial physical address includes a physical address portion that corresponds to a respective NVM module 102 or a subset thereof, such as a die plane on the respective NVM module 102 (e.g., the partial physical address is or includes a physical address of the respective NVM module 102 or the subset thereof). Translation controller 124 communicates the partial physical addresses and the LBAs to the appropriate NVM controller(s) 130 (FIG. 1B), which route the partial physical addresses and the LBAs to the appropriate NVM module 102 via channels 106 (e.g., along with data and other information, as necessary). NVM module controller 104 of the NVM module 102 receives the memory operation command, including the partial physical address(es) and LBA(s), determines the corresponding die (or dies), and forwards the memory operation command to those die (or dies). In some circumstances, for example, this includes mapping each partial physical address to a physical address (e.g., a full physical address) specifying a physical location of memory within NVM die 140/142 that are applicable to the host commands.

In either case, in some embodiments, when NVM module controller 104 determines a physical address, NVM module controller 104 further determines if remap table 108 includes an entry corresponding to the physical address. Such an entry indicates that a physical-to-physical address remapping is assigned for the physical address, meaning that NVM module controller 104 is to redirect host specified memory operations directed to the physical address (e.g., by NVM controller 130) to a second physical address within NVM die 140/142.

Figure 2B:
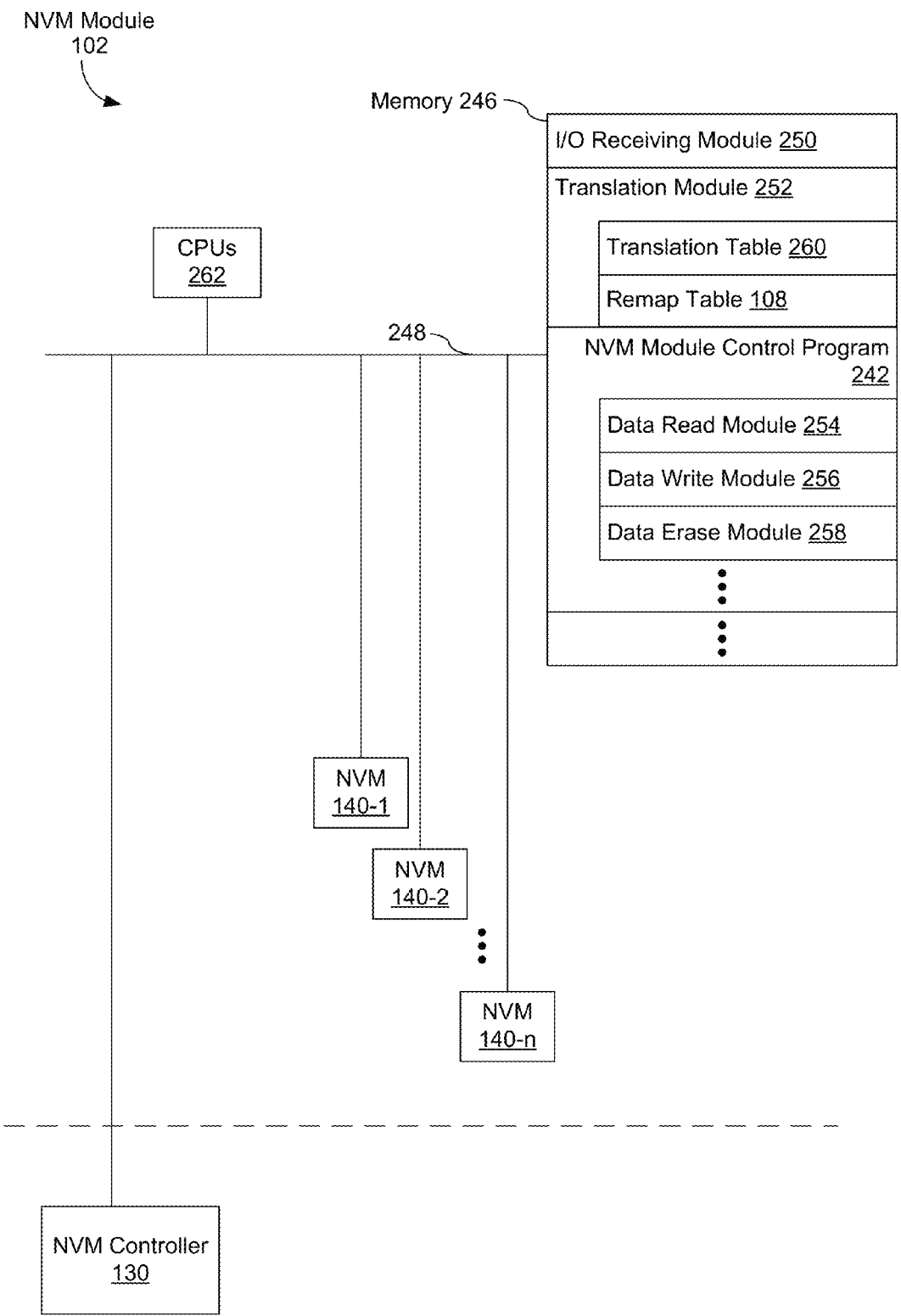
FIG. 2B is a block diagram illustrating an exemplary non-volatile memory module, in accordance with some embodiments.

To achieve these ends, in some embodiments, each NVM module controller of NVM module controllers 104 includes one or more processing units (sometimes called CPUs or processors or microprocessors or microcontrollers) configured to execute instructions in one or more programs stored in memory (e.g., in NVM module control program 242, FIG. 2B). In some embodiments, NVM module controller 104's processing units and memory are integrated as part of an application specific integrated circuit (ASIC) that is packaged together with one or more NVM die 140/142.

Data storage system 100 may include various additional features that have not been illustrated for the sake of brevity and so as not to obscure more pertinent features of the example implementations disclosed herein, and a different arrangement of features may be possible.

FIG. 2A is a block diagram illustrating an exemplary storage controller 120, in accordance with some embodiments. Storage controller 120 typically includes memory 206, one or more processing units (CPUs) 222 for executing modules, programs and/or instructions stored in memory 206 and thereby performing processing operations, and one or more communication buses 208 for interconnecting these components. Communication buses 208 optionally include circuitry (sometimes called a chipset) that interconnects and controls communications between system components. Storage controller 120 is coupled to computer system 110 and NVM modules 102 by communication buses 208. Memory 206 includes high-speed random access memory, such as DRAM, SRAM, DDR RAM or other random access solid state memory devices, and may include non-volatile memory, such as one or more magnetic disk storage systems, optical disk storage systems, flash memory devices, or other non-volatile solid state storage systems. Memory 206 optionally includes one or more storage systems remotely located from the CPU(s) 222. Memory 206, or alternately the non-volatile memory device(s) within memory 206, comprises a non-transitory computer readable storage medium. In some embodiments, memory 206, or the computer readable storage medium of memory 206 stores the following programs, modules, and data structures, or a subset thereof:

- Input/output (I/O) receiving module 210 that receives host commands (e.g., read/write/erase commands) and/or data from computer system 110;
- Translation module 212 that manages host commands by mapping logical block addresses to physical addresses or partial physical addresses (e.g., NVM-module-level, chip-level, bank-level, or die-level physical addresses) in a physical address space (such logical-to-physical mappings are optionally stored in translation table 220);
- Non-volatile memory (NVM) control module 202 that is used to facilitate host commands (e.g., read/write/erase commands), optionally including:

Data read module 214 that is used for interacting with and reading data from one or more NVM modules 102;

Data write module 216 that is used for interacting with and writing data to one or more NVM modules 102;

Data erase module 218 that is used for interacting with and erasing data from one or more blocks in one or more NVM modules 102; and Optional additional module(s) 224 that perform endurance management, RAID management, compression, error correction encoding/decoding, encryption, wear leveling, garbage collection, and other tasks.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 206 may store a subset of the modules and data structures identified above. Furthermore, memory 206 may store additional modules and data structures not described above. In some embodiments, the programs, modules, and data structures stored in memory 206, or the computer readable storage medium of memory 206, provide instructions for implementing any of the methods described below with reference to FIGS. 6A-6C and/or FIGS. 7A-7B.

Although FIG. 2A shows storage controller 120 in accordance with some embodiments, FIG. 2A is intended more as a functional description of the various features which may be present in storage controller 120 than as a structural schematic of the embodiments described herein. In practice, and as recognized by those of ordinary skill in the art, items shown separately could be combined and some items could be separated.

FIG. 2B is a block diagram illustrating an exemplary non-volatile memory (NVM) module 102, in accordance with some embodiments. Non-volatile memory module 102 typically includes memory 246, one or more processing units (CPUs) 262 for executing modules, programs and/or instructions stored in memory 246 and thereby performing processing operations, and one or more communication buses 248 for interconnecting these components. Communication buses 248 optionally include circuitry (sometimes called a chipset) that interconnects and controls communications between system components. Non-volatile memory (NVM) module 102 is coupled to NVM controller 130 and NVM die 140 by communication buses 248 (e.g., which optionally include channels 106 and their data buses). Memory 246 includes high-speed random access memory, such as DRAM, SRAM, DDR RAM or other random access solid state memory devices, and may include non-volatile memory, such as one or more magnetic disk storage systems, optical disk storage systems, flash memory devices, or other non-volatile solid state storage systems. Memory 246 optionally includes one or more storage devices shared with NVM controller 130, and/or storage controller 120, and/or other NVM modules 102. Alternatively, memory 246 and/or the instructions, programs, modules, and/or data structures stored thereon comprise firmware. In some embodiments, NVM module 102 is or includes an application specific integrated circuit (ASIC) that includes CPU(s) 262 and/or memory 246. Memory 246, or alternately the non-volatile memory device(s) within memory 246, comprises a non-transitory computer readable storage medium.

It is noted that in some embodiments, memory operation commands received by NVM module 102 specify physical addresses, either because the corresponding host commands specify physical addresses, or because storage controller 120 has already mapped logical addresses in received host commands to physical addresses. In some embodiments, the physical address specified by a memory operation command received at NVM module 102 is a partial physical address, which does not completely specify the physical location to which the memory operation is directed, in which case the received memory operation command also includes a logical address. In the latter example, the two addresses (partial physical address and logical address) in memory operation command received by NVM module 102 are processed by NVM module 102 to produce a physical address.

In some embodiments, memory 246, or the computer readable storage medium of memory 246 stores the following programs, modules, and data structures, or a subset thereof:

Input/output (I/O) receiving module 250 that receives at least a portion of respective memory operation commands (e.g., read/write/erase commands, sometimes called host commands) and/or data from NVM controller 130 or storage controller 120. In some embodiments, the memory operation commands include partial physical addresses (e.g., a NVM-module-level physical address for NVM module 102, a die-plane-level physical address, or a block-level physical address) and a logical block address (e.g., conveyed from computer system 110);

An optional translation module 252 that manages host commands by (1) mapping received physical addresses (received from storage controller 120, and optionally from translation controller 124) to physical addresses; or by (2) mapping logical block addresses and partial physical addresses (both received from storage controller 120) to physical addresses (e.g., block-level or page-level physical addresses) in a physical address space. Such physical-to-physical mappings are optionally stored in translation table 260. After mapping a memory operation command's physical or partial physical address(es) to physical address(es), translation module 252 determines if the physical address(es) have remap assignments stored in remap table 108 and, if so, processes the host commands in accordance with the remap assignments (e.g., an assignment of a different physical address); and A non-volatile memory (NVM) module control program 242 that is used to facilitate the at least portions of respective host commands (e.g., read/write/erase commands), optionally including:

Data read module 254 that is used for interacting with and reading data from one or more NVM die 140;

Data write module 256 that is used for interacting with and writing data to one or more NVM die 140; and Data erase module 258 that is used for interacting with and erasing data from one or more blocks in one or more NVM die 140.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 246 may store a subset of the modules and data structures identified above. Furthermore, memory 246 may store additional modules and data structures not described above. In some embodiments, the programs, modules, and data structures stored in memory 246, or the computer readable storage medium of memory 246, provide instructions for implementing any of the methods described below with reference to FIGS. 6A-6C and/or FIGS. 7A-7B.

Figure 3A:
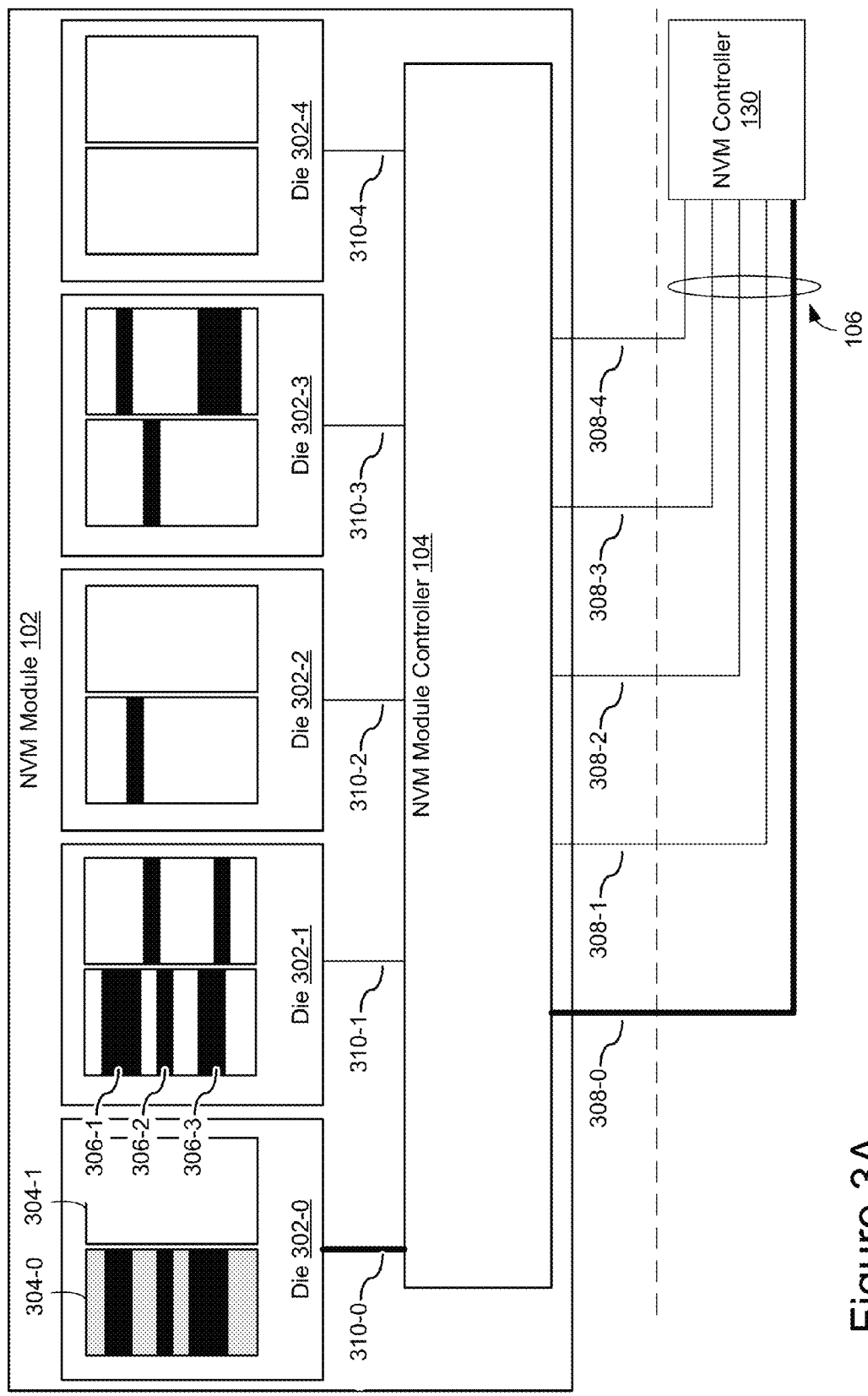
FIGS. 3A-3B illustrate operation of a memory module without and with, respectively, remapping of bad units of memory, in accordance with some embodiments.
Figure 3B:
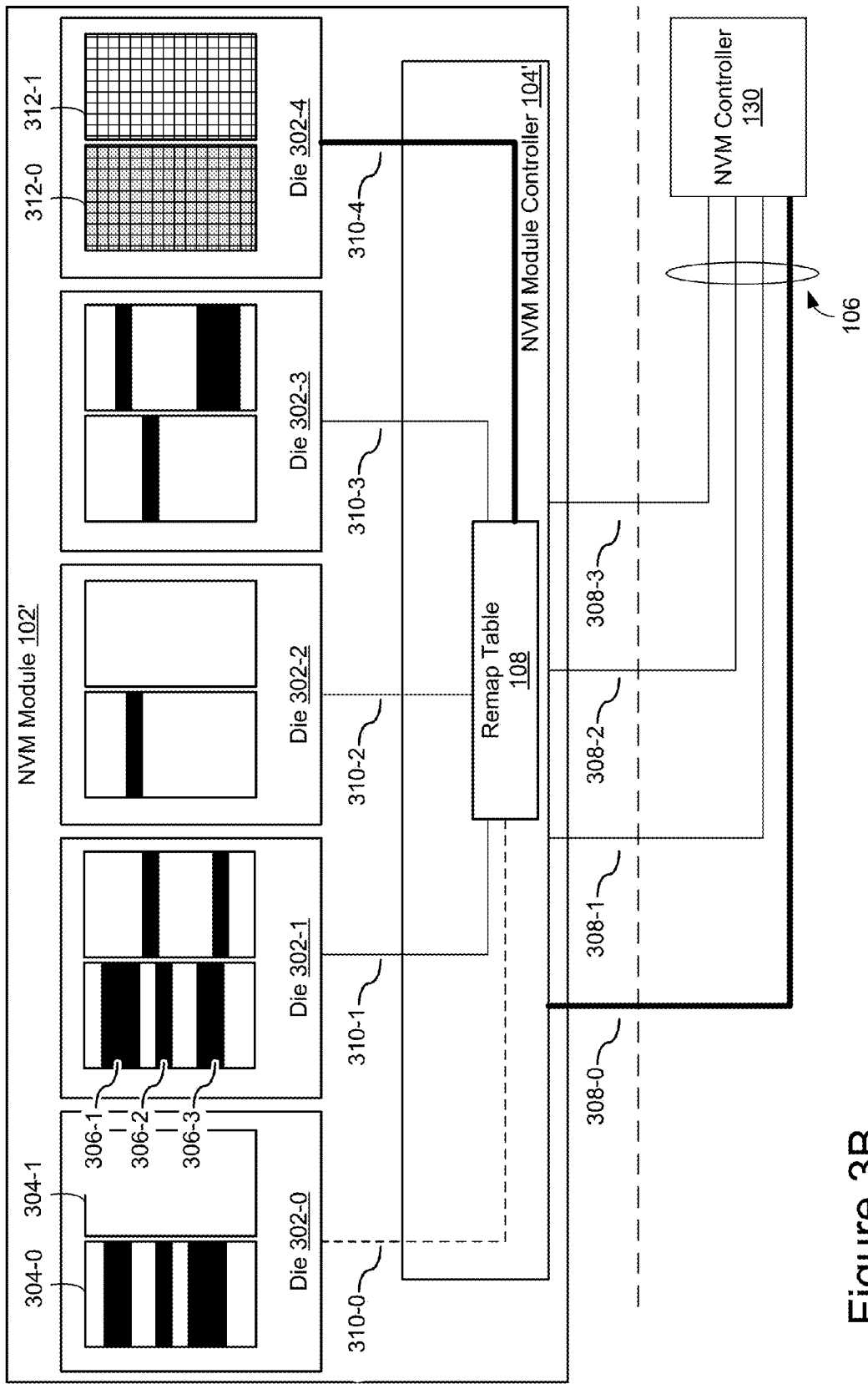

FIGS. 3A-3B illustrate operation of memory module 102 without and with, respectively, remapping of bad units of memory, in accordance with some embodiments.

FIG. 3A illustrates operation of memory module 102 without remapping of bad units of memory, in accordance with some embodiments. In this example, memory module 102 is shown with five die 302 (e.g., die 302-0 through die 302-4), however, one of skill in the art will appreciate that memory module 102 can be constructed with more or fewer die, depending on the circumstances. In some embodiments, each die 302 includes two die planes 304 (e.g., die planes 304-0 and 304-1; the remainder of the die planes in FIG. 3A are not labeled for visual clarity). As used herein, the term die plane refers to a portion of memory on a die that has its own (e.g., dedicated) circuitry with which to execute memory operations (e.g., each die plane has its own sense amplifier(s), and the like). In this manner, memory module 102 can execute memory operations on different die planes in parallel. Again, one of skill in the art will understand that in some embodiments each die 302 can have more, or fewer, than two die planes 304. In some circumstances, die planes 304 include bad regions 306 (e.g., bad regions 306-1, 306-2, and 306-3) that cannot be reliably written to and/or read from. In FIGS. 3A-3B, bad regions are illustrated as black stripes within the die planes. Depending on the circumstances, bad regions may include a single word line or a group (e.g., a plurality) of word lines. In various circumstances, the bad regions may be completely unusable as-manufactured, may have been manufactured with defects such that they failed a burn-in test, may have an unacceptably high bit error rate (BER), and/or have a combination of these problems. In addition, in some embodiments, the bad regions are sub-units of the die planes (e.g., the bad regions are blocks of memory, or word lines of memory, or even pages of memory).

Because die plane 304-0 largely consists of bad regions, in the example shown in FIG. 3A, die plane 304-0 is designated as a bad die plane, or a bad unit of memory. More specific criteria as to what constitutes a bad unit of memory are described below with reference to method 600.

In this example, NVM controller 130 sends first address signals 308 (e.g., physical address signals) to NVM module 102 whenever a host command is received that requires data to be written to, read from, or erased from memory on NVM module 102. The first address signals are sufficient to fully specify the proper die plane and activate a corresponding second address signal 310 (e.g., a physical address signal). For example, activation of first address signal 308-0 instructs the memory module to activate die plane 304-0 via second physical address signal 310-0.

In the example shown in FIG. 3A, first address signals 308 are "hardwired" (e.g., permanently or invariantly routed) to second address signals 310. For example, when first address signal 308-0 is activated, second address signal 310-0 is activated; when first address signal 308-1 is activated, second address signal 310-1 is activated; and so on. One way to deal with the fact that first address signal 308-0 leads to a bad die plane 304-0 is to ignore the die plane, for example, by removing die plane 304-0's physical address from the pool of available physical addresses from which to assign logical addresses. However, if die plane 304-0 is part of a RAID stripe, ignoring die plane 304-0 makes the RAID stripe smaller, which is disadvantageous. For example, if a storage controller is configured to write to an entire RAID stripe at once, in parallel, ignoring a die plane within said RAID stripe reduces the amount of write operations that occur in the time it takes to write the RAID stripe (by virtue of reducing the number of write operations performed while writing the RAID stripe). The bold line in FIG. 3A, spanning first address signal 308-0 and second address signal 310-0, indicates the routing of a memory operation.

In contrast, FIG. 3B illustrates an NVM module 102' that is similar to the NVM module 102 of FIG. 3A, except that the NVM controller 104' of NVM module 102' does not "hardwire" first address signals 308 to the second address signals 310. Instead, when the NVM module 102' receives a first address signal 308-0 corresponding to die plane 304-0, NVM module 102' (and more specifically, NVM module controller 104'), determines whether remap table 108 includes a second address assigned to die plane 304-0. Because die plane 304-0 is, in this example, a bad die plane, remap table 108 includes a second address assignment corresponding to a reserve die plane 312. Specifically, in this example, remap table 108 stores a physical-to-physical remapping indicating a second physical address that includes at least a number of most significant bits (MSBs) of a full address to specify that die plane 304-0 is remapped to reserve die plane 312-0. Thus, a memory operation directed to die plane 304-0 by first address signal 308-0 is redirected to reserve die plane 312-0. The bold line in FIG. 3A, spanning first address signal 308-0 and second address signal 310-4, indicates the routing of the memory operation. The dashed line, spanning second address signal 310-0, indicates how the memory operation would have been routed had the physical-to-physical address remapping not been performed.

In addition, in FIG. 3B, die 302 are over-provisioned, in accordance with some embodiments, and there are fewer first address signals 308 than second address signals 310. It should also be noted that, in some embodiments, first address signals 308 share a common bus over which physical addresses (e.g., having a die select and die plane select portion) are conveyed as data, while second address signals 310 are each conveyed using a corresponding set of physical circuitry for activating a particular die plane (e.g., second address signal 310-0 is conveyed by activating a die select wire and a die plane select wire corresponding to die plane 304-0).

Figure 4A:
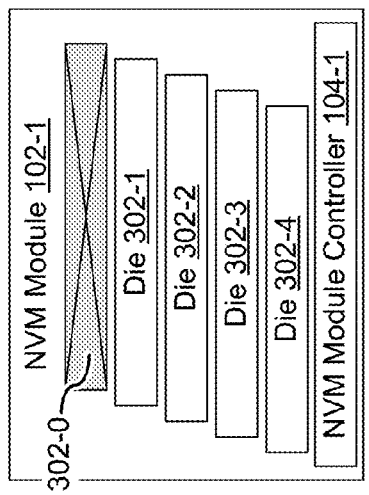
FIGS. 4A-4B illustrate RAID striping without and with, respectively, physical-to-physical remapping of bad units of memory, in accordance with some embodiments.
Figure 4A:
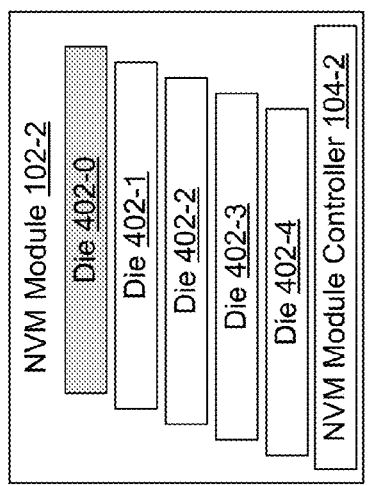
Figure 4A:
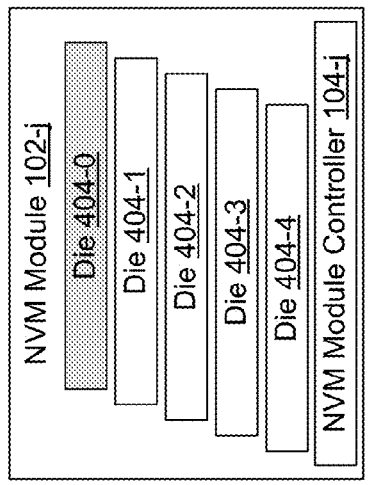
Figure 4B:
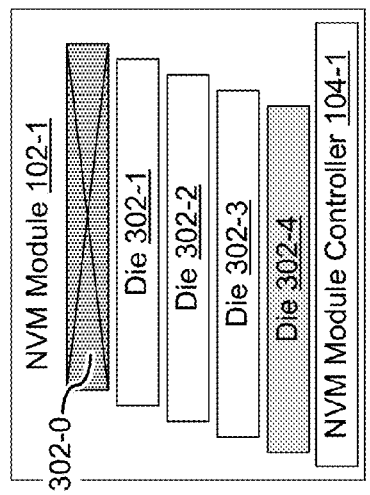
Figure 4B:
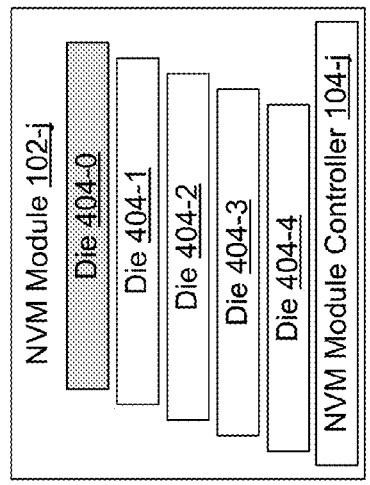

FIGS. 4A-4B illustrate RAID striping without and with physical-to-physical remapping of bad units of memory, in accordance with some embodiments. For visual clarity, in this example, the physical-to-physical remapping is performed on the die level, although it should be appreciated that the physical-to-physical remapping could alternatively be performed on a differently sized unit of memory (e.g., on the die plane level, as explained with reference to FIGS. 3A-3B).

In FIG. 4A, a plurality of NVM modules 102 is shown, including NVM module 102-1, 102-2, through 102-j. A storage controller (not shown), is configured to use a single die from each NVM module 102 to construct a RAID stripe. For example, a RAID stripe is shown in gray in FIG. 4A, comprising: die 302-0 from NVM module 102-1; die 402-0 from NVM module 102-2; and die 404-0 from NVM module 102-j. If j is larger than 3, additional die would be included from the NVM modules 102-2 to 102-j−1. The storage controller is configured to write the RAID stripe in parallel, meaning that write operations are performed on die 302-0, 402-0, and 404-0 at the same time. However, in this example, die 302-0 is a bad die plane, and for that reason is ignored (not written too). This effectively reduces the size of the RAID stripe, and reduces the number of write operations that occur in the time it takes to write the RAID stripe (because fewer operations are being performed in the absence of die 302-0 as a viable part of the RAID stripe).

It should be understood that a RAID stripe is used here merely as an example. The functionality described with reference to FIGS. 4A-4B is equally applicable to any situation in which data is being written in parallel to a plurality of units of memory.

FIG. 4B is analogous to FIG. 4A, except that bad die 302-0 has been remapped to die 302-4, where both die are in the same NVM module, thus maintaining the size of the RAID stripe and optimizing the efficiency of parallel memory operations performed on the RAID stripe (e.g., read/write processes).

FIGS. 4A-4B also illustrate exemplary embodiments in which the plurality of die are packaged in a 3D configuration. In one example, NVM modules 102 are DIMM modules or flip-chip modules, each having a plurality of die on thin substrates that are stacked vertically atop an NVM module controller 104, which can be an application specific integrated circuit (ASIC) fabricated on its own substrate.

Figure 5:
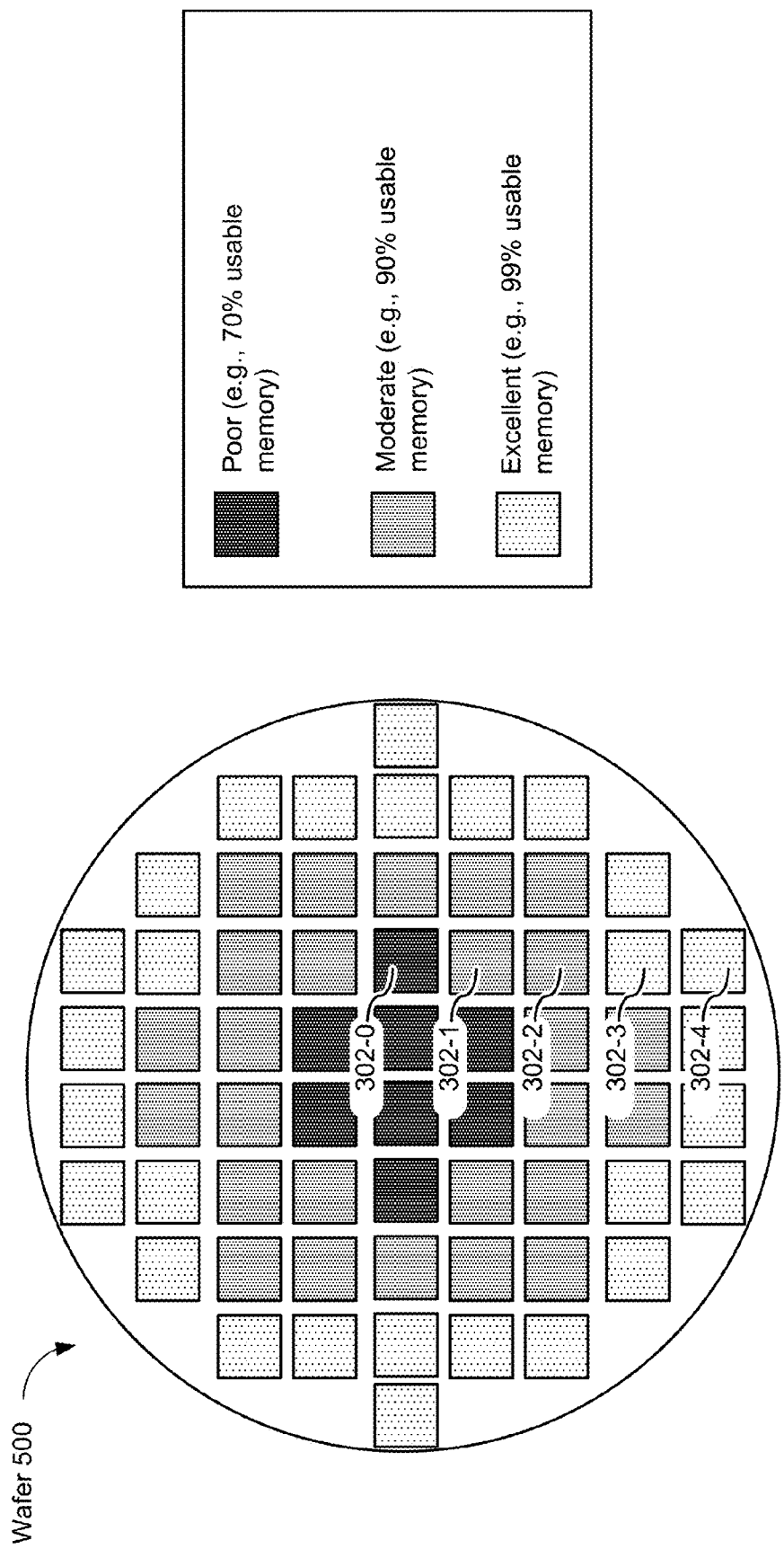
FIG. 5 illustrates selection of memory die for packaging into a memory module, using statistical die information, in accordance with some embodiments.

FIG. 5 illustrates selection of die for packaging into a memory module (e.g., NVM module 102, FIG. 1B) using statistical die information, in accordance with some embodiments. In particular, in some circumstances, a plurality of die 302 (e.g., die 302-0 through die 302-4) are selected for packaging into a memory module (e.g., NVM module 102-1, FIG. 4B) from a set of non-volatile memory die that have been fabricated on a wafer 500. In some circumstances, predefined die-level and sub-die-level tests have been deferred on the set of non-volatile memory die until after packaging, in accordance with predefined criteria and predefined statistical die performance information corresponding to the set of non-volatile memory die. For example, although the predefined tests have been deferred on the particular die fabricated on wafer 500, reliability data from previous wafers subjected to the same processing may be known (e.g., test wafers, see description of method 700 described with reference to FIGS. 7A-7B). Consider, as one example (illustrated by way of wafer 500), a fabrication process which leads to statistical differences in die reliability depending on the die's position on the wafer (e.g., radial wafer position with respect to the center of wafer). In the example shown, die that are fabricated toward the center of wafer 500 have poor reliability (e.g., having approximately 70% usable memory), die that are fabricated within a middle radial ring of wafer 500 have moderate reliability (e.g., having approximately 90% usable memory), while die that are fabricated within an outer radial ring of wafer 500 have excellent reliability (e.g., having approximately 95% usable memory). This statistical information can be used along with over-provisioning of die within a memory module to select die 302 such as to guarantee, within a predefined statistical tolerance (e.g., 2-sigma (about 95.45%), 3-sigma (about 99.7%), or 3.5-sigma (about 99.95%)), an amount of usable memory within the memory module.

Figure 6B:
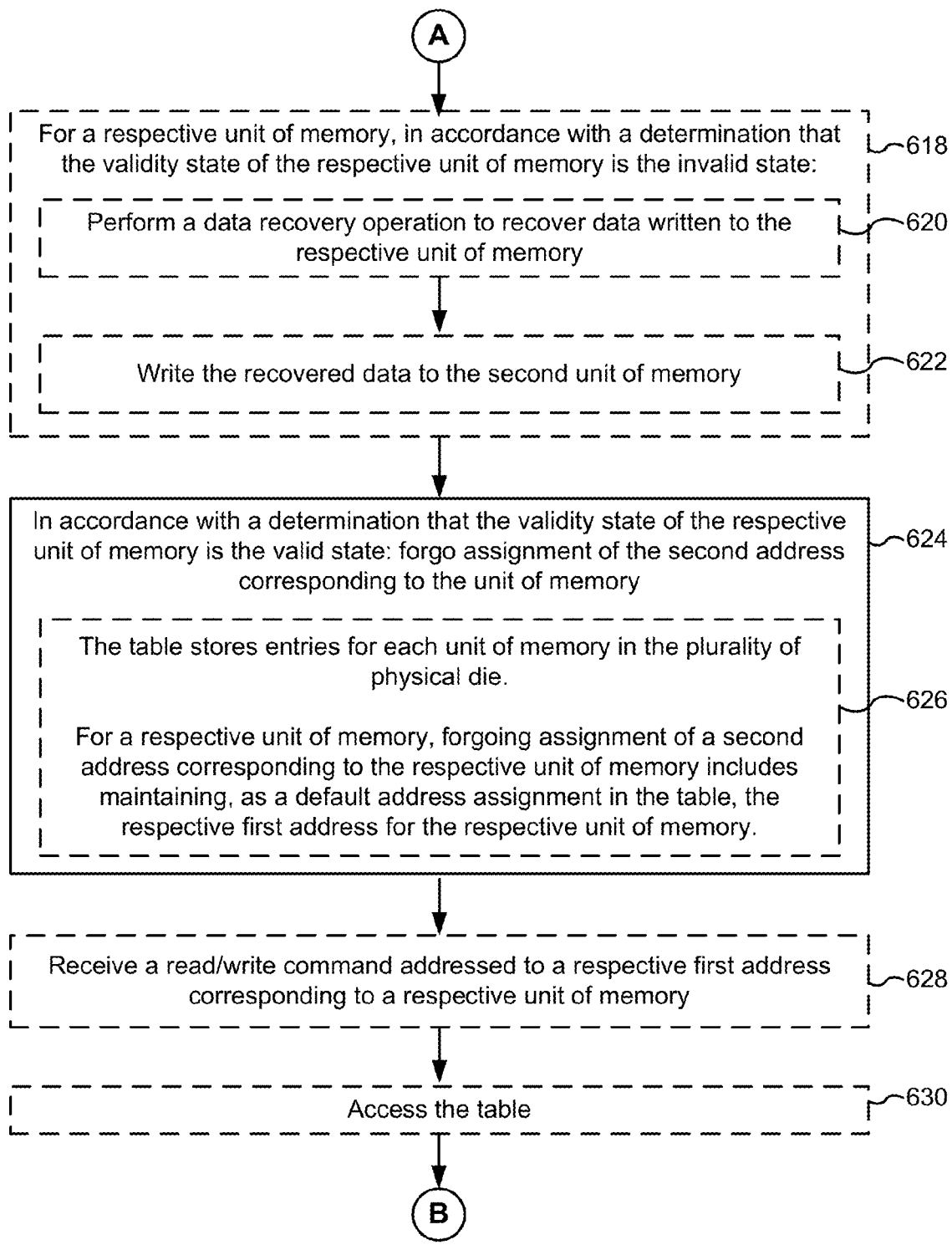
Figure 6C:
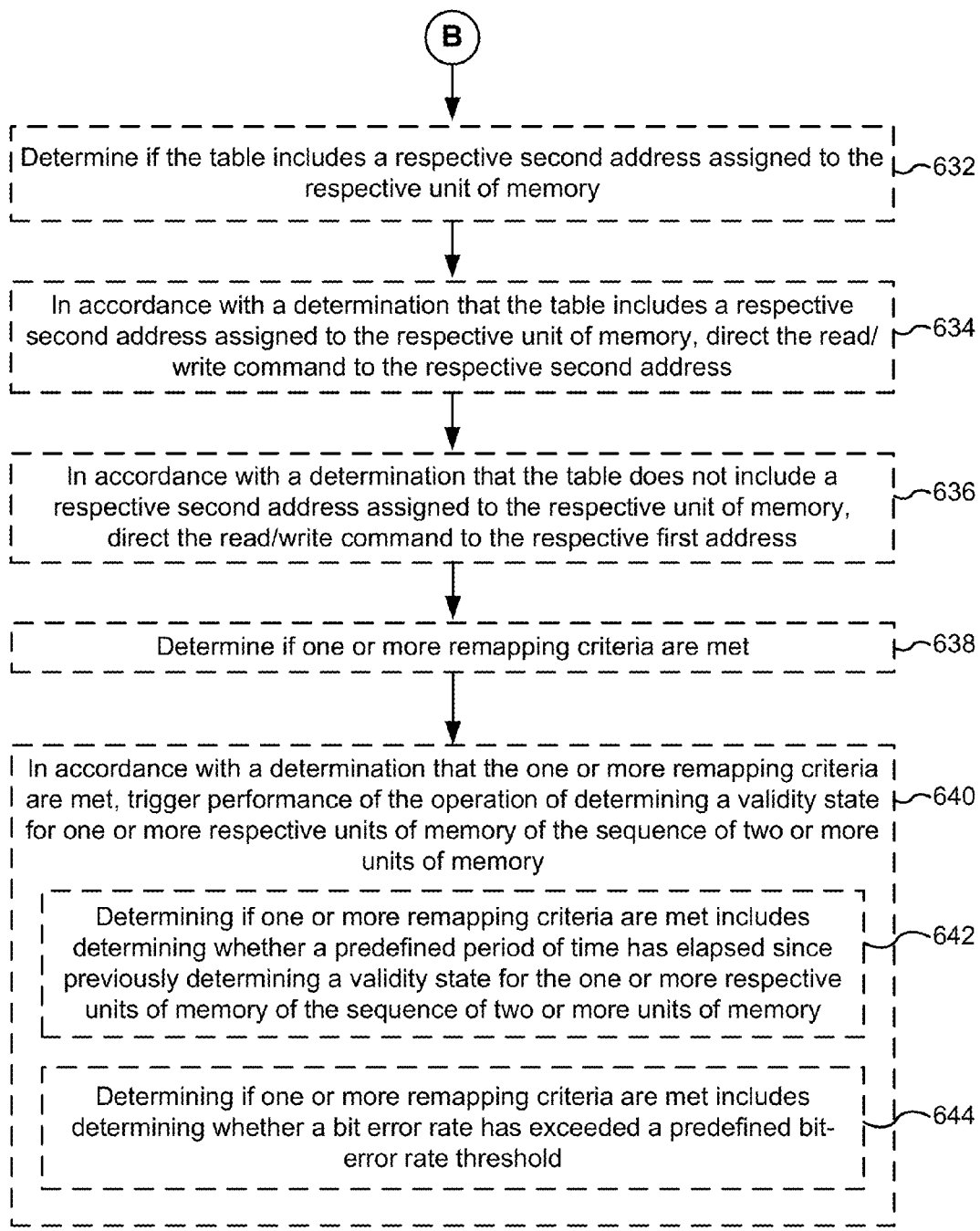

FIGS. 6A-6C illustrate a flowchart representation of method 600 for physical-to-physical address remapping, in accordance with some embodiments. At least in some embodiments, method 600 is performed by a non-volatile memory (NVM) module (e.g., NVM module 102, FIG. 1B). Alternatively, method 600 is performed by a storage controller (e.g., storage controller 120, FIG. 1B). In some embodiments, method 600 is governed by instructions that are stored in a non-transitory computer readable storage medium and that are executed by one or more processors of a memory module. (e.g., the one or more processors 262 of memory module 102, FIG. 2B), and/or one or more processors of a storage controller (e.g., one or more processors 222 of storage controller 120, FIG. 2A). In various implementations, some operations in of the method may be combined and/or the order of some operations may be changed from the order shown in the figures. Also, in some implementations, operations shown in separate figures (e.g., FIGS. 7A-7B) and/or discussed in association with separate methods (e.g., method 700) may be combined to form other methods, and operations shown in the same figure and/or discussed in association with the same method may be separated into different methods.

Regardless, method 600 is performed at a memory device (e.g., data storage system 100, FIG. 1B) that includes a plurality of physical die of non-volatile memory (e.g., packaged into a memory module, such as memory module 102, FIG. 1B). In some embodiments, the plurality of physical die is divided into units of memory (e.g., portions or segments of memory, such as die planes, blocks, pages, and word lines) each being addressable by a respective first address.

In some embodiments, the plurality of physical die of non-volatile memory is a plurality of flash memory die. In some embodiments, the plurality of flash memory die includes NAND-type flash memory or NOR-type flash memory. In other embodiments, the plurality of physical die of non-volatile memory comprises one or more other types of non-volatile memory (e.g., resistive RAM (ReRAM)). In some embodiments, the storage system comprises one or more memory modules (e.g., NVM modules 102, FIGS. 1A-1B) and the memory modules comprise one or more physical die of non-volatile memory. For example, in some implementations, the storage system includes dozens or hundreds of memory modules, organized in parallel memory channels (e.g., channels 106, FIG. 1B), such as 4, 8, 16, 32 or 64 memory modules per memory channel, and 8, 16 32 or 64 parallel memory channels. In some embodiments, the storage system is a single flash "thumb drive" or solid-disk drive (SSD).

For ease of explanation, method 600 is described as being performed by a memory module, although this need not be the case.

For each respective unit of memory of a sequence of two or more units of memory in a plurality of physical die of non-volatile memory, the memory module determines (602) a validity state of the respective unit of memory. The validity state is one of a valid state and an invalid state. In some embodiments, each unit of memory is a predefined contiguous unit of memory (e.g., each unit of memory is a contiguous portion or segment of physical memory having a predefined size).

In some embodiments, for a respective unit of memory, the validity state is based (604) on as-manufactured characteristics of the respective unit of memory. For example, various defects introduced during the manufacturing process can cause individual memory elements, word lines, or larger regions of memory to be unusable as-manufactured. Other defects introduced during manufacturing may cause individual memory elements (or larger regions of memory) to be severely compromised as-manufactured, meaning that the individual memory elements are likely to become unusable after a small number of P/E cycles (e.g., 10 program/erase cycles). Both of these cases—memory characterized in that it is unusable as-manufactured and memory characterized in that it is severely compromised as-manufactured—fall under the meaning of "as-manufactured characteristics."

An invalid state for a unit of memory indicates that the unit of memory is "bad," which in various circumstances means that the unit of memory is unusable, cannot be written to, cannot be read from, or a bit error rate (BER) for the unit of memory is above a certain threshold. Alternatively, in some embodiments, each respective unit of memory comprises (606) a plurality of sub-units of memory. Determining a validity state of a respective unit of memory includes determining whether a predefined number (or percentage, or fraction) of the plurality of sub-units of memory are writable. For example, in some embodiments, the units of memory are die planes (or blocks) and the sub-units are pages, and for each die plane (or block) the memory module determines whether more, or less, than 90% (e.g., a predefined percentage) of the pages are writable. If more than 90% of the pages in a die plane (or block) are writeable, the memory module determines that the validity state of that die plane (or block) is the valid state, and if not, determines that the validity state is the invalid state. As another example, in some embodiments, each die plane includes 8224 blocks, each made up of 64 pages. The memory module, in this example, determines, for each block, whether at least 58 pages are writeable, and if so, determines that the validity state of the block is the valid state, and if not, determines that the validity state is the invalid state. In some embodiments, the memory module achieves this determination by writing test data to the sub-units as well as to a buffer (e.g., in volatile memory), reading the data from the sub-units and performing a comparison between the read data and the data in the buffer. When a unit of memory has a validity state that is the invalid state, the unit of memory is said to be a "bad" unit of memory or an "invalid" unit of memory. Conversely, when a unit of memory has a validity state that is the valid state, the unit of memory is said to be a "good" unit of memory or a "valid" unit of memory.

In some embodiments, determining the validity state comprises receiving information from a storage controller external to the memory module (e.g., storage controller 120, FIG. 1B), for example, during drive initialization or during normal operation of the drive that includes the memory module. As one example, the storage controller performs various encoding/decoding tasks through which a bit error rate (BER) is determined. In some embodiments, the storage controller communicates the BER to the memory module during drive initialization or during normal operation so that the memory module can determine the respective validity states of units of memory on the memory module.

In accordance with a determination that the validity state of the respective unit of memory is the invalid state: the memory module stores (608), in a table (sometimes called a "remap" table), a second address assigned to the respective unit of memory. At least a portion of the second address is a physical address portion corresponding to a physical location of a second unit of memory that is distinct from the respective unit of memory. In some embodiments, assigning each second address includes assigning a predetermined number of most significant bits (MSBs) of a full physical address in a physical address space. In one example, memory module is configured to operate with 32-bit physical addresses. The four most significant bits of a 32-bit physical address may correspond, in this example, to a die address. The remaining 28-bits (e.g., the remaining least significant bits) are available to indicate block and page addresses. The memory module, having determined that a particular die is a "bad" die, remaps the bad die to a good die by storing, in the table, the four most significant bits of the bad die and the four most significant bits in the good die. Further, when the memory module receives a memory operation command with a physical address, in this example, the memory module compares the four most significant bits of the memory operation command to entries in the table. If an entry is found, the memory module uses the four most significant bits of the remapped "good" die instead of the four most significant bits in the memory operation command to execute the received memory operation command.

In some embodiments, the table is stored in non-volatile memory (e.g., on the plurality of non-volatile memory die). In some embodiments, the table is stored in volatile memory (e.g., dynamic random access memory, also known as "DRAM").

In some embodiments, the memory module designates (610), or reserves, one or more units of memory of the plurality of physical die as reserve units of memory (e.g., reserve die planes 312-0 and 312-1, FIG. 3B). The memory module assigns (612) each second address from among the one or more units of memory designated as reserve units of memory. In some embodiments, method 600 is performed during an initialization procedure at the beginning of the product lifetime of the memory module. In such embodiments, the reserve units of memory are designated as such when the memory module is assembled. In some embodiments, method 600 is performed repeatedly throughout the product lifetime of the memory module, as described in greater detail below. In such embodiments, a fixed number of units of memory can be designated as "reserve" memory when the device is assembled, or alternatively, previously "unreserved" units of memory can be changed to reserved units of memory as-needed by transferring the data stored therein elsewhere and maintaining a list of second addresses corresponding to the newly reserved units of memory as addresses available for remapping.

In some embodiments, storing the assignment of respective second addresses of one or more invalid units of memory (e.g., "bad" units of memory) preserves the number of concurrent parallel read/write operations that are performed on valid units of memory by remapping the invalid units of memory to valid units of memory (e.g., rather than simply ignoring the bad units of memory by not reading or writing real data thereto). This increases the efficiency of memory operations, which, in some circumstances, can be measured as the ratio of a number of read/write operations divided by a time required to perform said read/write operations. Since the time required to perform said memory operations in parallel is no less if bad units of memory are ignored (e.g., not written to or read from), ignoring bad units of memory reduces the numerator of the efficiency whereas remapping bad units of memory to good units of memory maintains the numerator as fixed.

More specifically, in some embodiments, the memory module is configured (614) to concurrently perform N parallel read/write operations, where N is an integer greater than 2. For each respective unit of memory determined to be in the invalid state, the respective second address is an address that preserves the non-volatile memory module's ability to perform N parallel read/write operations. In some embodiments, this is achieved by performing the remapping on the same units of memory for which the memory module supports parallel operations. For example, when the memory module is configured to execute host commands (or portions thereof) on separate die planes in parallel, in some embodiments, the remapping is also performed on the die plane level. That is to say, in some embodiments, the assigned second addresses in the table (e.g., remap table 108, FIG. 2B) are die plane addresses that include a number of most significant bits (MSBs) sufficient to specify a die plane of memory. This is advantageous because in these embodiments the remapping does not interfere with parallel processes, for example, by remapping two blocks to the same die plane, wherein the two blocks could have otherwise been written in parallel by virtue of being on different die planes.

As an example, in some embodiments, a redundant array of independent drives (RAID) scheme is employed in which the plurality of physical die is partitioned into RAID stripes (e.g., each unit of memory is assigned to at least one RAID stripe) and a storage controller is configured to concurrently perform parallel write operations on each unit of memory within a given RAID stripe (i.e., the RAID stripe is written in a single parallel operation). In some embodiments, method 600 is performed on each unit of memory in a RAID stripe such that bad units of memory within the RAID stripe are remapped to valid units of memory in such a manner as to preserve the memory module's ability to write the entire RAID stripe in parallel. Thus, the RAID stripe stays "intact." In some embodiments, a RAID stripe includes a single page, block, or die plane from each die in a memory module. Alternatively, method 600 is performed at a storage controller in communication with a plurality of memory modules, and a RAID stripe includes a single page, block, die plane or die from each memory module across the plurality of modules.

Alternatively, in some embodiments, the remapping is performed with a higher degree of granularity (e.g., on smaller units of memory) than die planes. For example, in some embodiments, the memory module is configured to execute memory operations on different die planes in parallel and the remapping is performed on the block level (e.g., the assigned second addresses in the table (e.g., remap table 108, FIG. 2B) are block addresses that include a number of most significant bits (MSBs) sufficient to specify a block of memory). This is advantageous because the higher degree of granularity means that less memory is potentially wasted (e.g., by not wasting remnant good sub-units of memory in an otherwise bad unit of memory).

In some embodiments, the table is (616) a sparse table storing respective second addresses for only the units of memory that have an invalid state. As one example, when the memory module determines that a unit of memory is invalid, the memory module creates a new entry in the table. When the memory module receives a memory operation command specifying a particular address, the memory module accesses the table and determines if an entry exists in the table corresponding to the address. If no entry is found, the memory module uses the address for the memory operation command, and if an entry is found, the memory module uses the assigned second address in the entry for the memory operation command.

Described below with reference to operation numbers 618-622, are various operations that are optionally performed when a unit of memory is found to be invalid.

In some embodiments, for a respective unit of memory, in accordance with a determination that the validity state of the respective unit of memory is the invalid state (618): the memory module performs (620) a data recovery operation to recover data written to the respective unit of memory. For example, in some embodiments, the memory module includes a plurality of die (e.g., eight die) with two die planes apiece (e.g., a first die plane and a second die plane).

As one example, the memory module will be configured to utilize, for data recovery, a RAID stripe that comprises one die plane from each of the die in the memory module. When a die plane is found to be invalid, the memory module will perform a RAID recovery to recover the data stored on the invalid die. The memory module then writes (622) the recovered data to the second unit of memory. Such embodiments are particularly useful when method 600 is performed periodically throughout the lifetime of the memory module (see operations 640-644) and an invalid unit of memory is likely to have useful data on it (e.g., a user's data).

Described below with reference to reference numbers 622-624, are various operations that are optionally performed when a unit of memory is found to be valid.

In accordance with a determination that the validity state of the respective unit of memory is the valid state: the memory module forgoes (624) assignment of the second address corresponding to the unit of memory. The table stores entries for each unit of memory in the plurality of physical die. In some embodiments, for a respective unit of memory, forgoing assignment of a second address corresponding to the respective unit of memory includes maintaining (626), as a default address assignment in the table, the respective first address for the respective unit of memory. For example, prior to method 600 being performed (e.g., during an initialization procedure when the memory module is produced), the table is created and populated with second address assignments for every unit of memory in the memory module, all of which are initially the same as each respective first address as a default. When a unit of memory is found to be invalid, the unit of memory's address is remapped to an available address in reserve memory. But when a unit of memory is found to be valid, this step is skipped, leaving the corresponding first address as the default second address.

In some embodiments, the memory module receives (628) a read/write command (e.g., a host command) addressed to a respective first address corresponding to a respective unit of memory. In some embodiments (e.g., when the table is a sparse table, as described with reference to operation 616), the memory module accesses (630) the table and determines (632) if the table includes a respective second address assigned to the respective unit of memory. For example, accessing the table includes, in some embodiments, reading the table from non-volatile memory. Alternatively, for example, when method 600 is performed by a storage controller rather than a memory module, in some embodiments, accessing the table includes reading the table from volatile memory (e.g., DRAM). In some embodiments, determining if the table includes a respective second address assigned to the respective unit of memory includes searching the table for a table entry corresponding to the respective unit of memory, for example, by using a hashed value of the unit of memory's first address.

In some embodiments, in accordance with a determination that the table includes a respective second address assigned to the respective unit of memory, the memory module directs (634) the read/write command to the respective second address. Conversely, in accordance with a determination that the table does not include a respective second address assigned to the respective unit of memory, the memory module directs (636) the read/write command to the respective first address. Thus, a bad (i.e., invalid) unit of memory is remapped to a good (i.e., valid) unit of memory.

In accordance with various embodiments, method 600 can be performed at a variety of times. For example, method 600 can be performed at predetermined times, such as only during drive initialization, or daily, or monthly, or yearly. Alternatively, method 600 can be performed only when certain conditions are met. Still alternatively, certain aspects (e.g., operations) of method 600 can be performed continuously. As one example, in some embodiments, the memory module continuously monitors a bit error rate (BER) of the units of memory within the memory module and remaps units of memory when their BERs are above a predefined threshold (e.g., a predefined BER threshold).

More generally, in some embodiments, the memory module determines (638) if one or more remapping criteria are met. In accordance with a determination that the one or more remapping criteria are met, the memory module triggers (640) performance of the operation of determining a validity state for one or more respective units of memory of the sequence of two or more units of memory. In some embodiments, triggering performance of the operation of determining a validity state for one or more respective units of memory includes triggering performance of any of the operations in method 600. As noted above, in some embodiments, determining if one or more remapping criteria are met includes (642) determining whether a predefined period of time has elapsed since previously determining a validity state for the one or more respective units of memory of the sequence of two or more units of memory. Alternatively, or in addition to, determining (644) if one or more remapping criteria are met includes determining whether a bit error rate has exceeded a predefined bit error rate threshold.

Figure 7A:
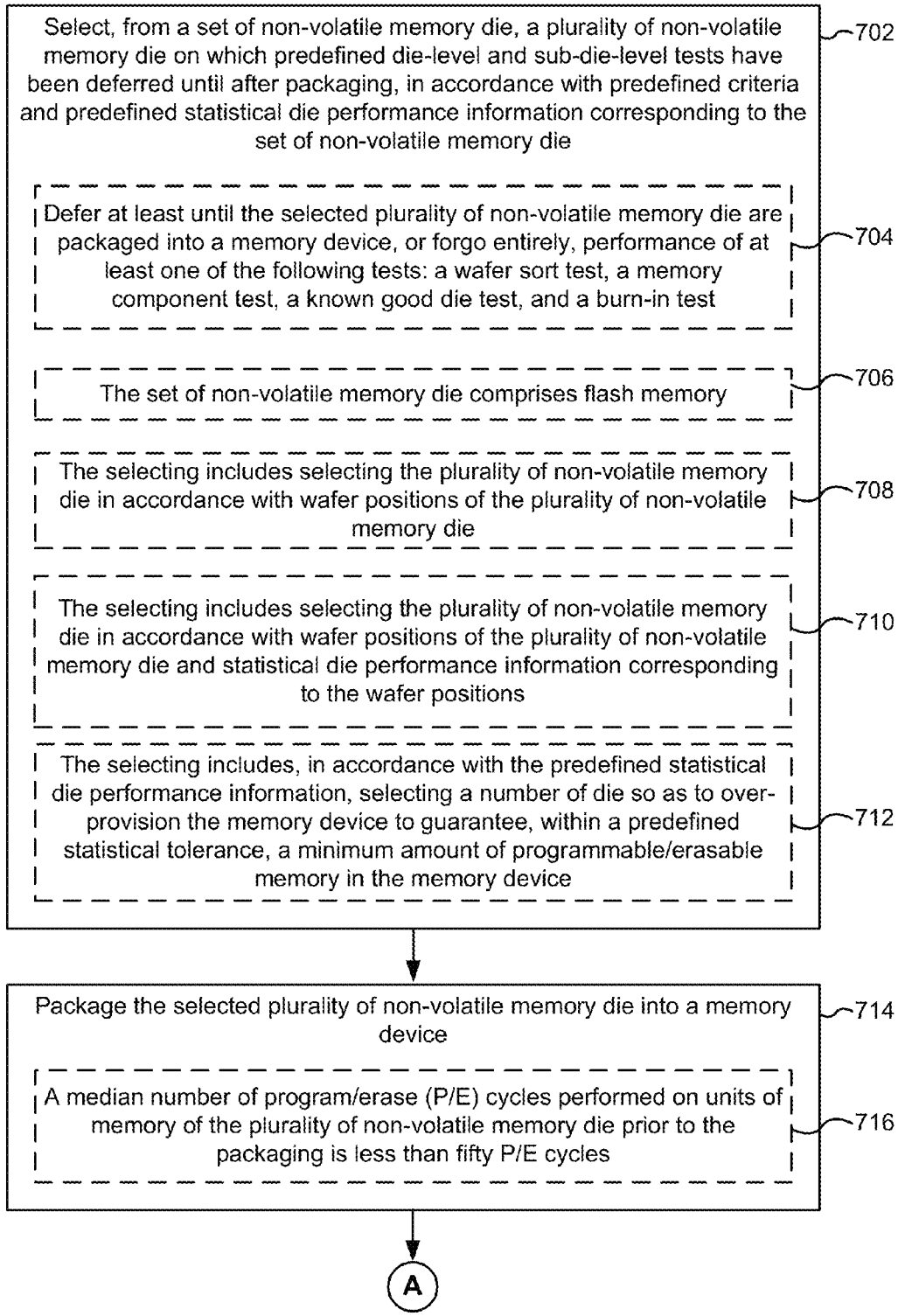
FIGS. 7A-7B illustrate a flowchart representation of a method for packaging non-volatile memory prior to performing at least some testing, in accordance with some embodiments.
Figure 7B:
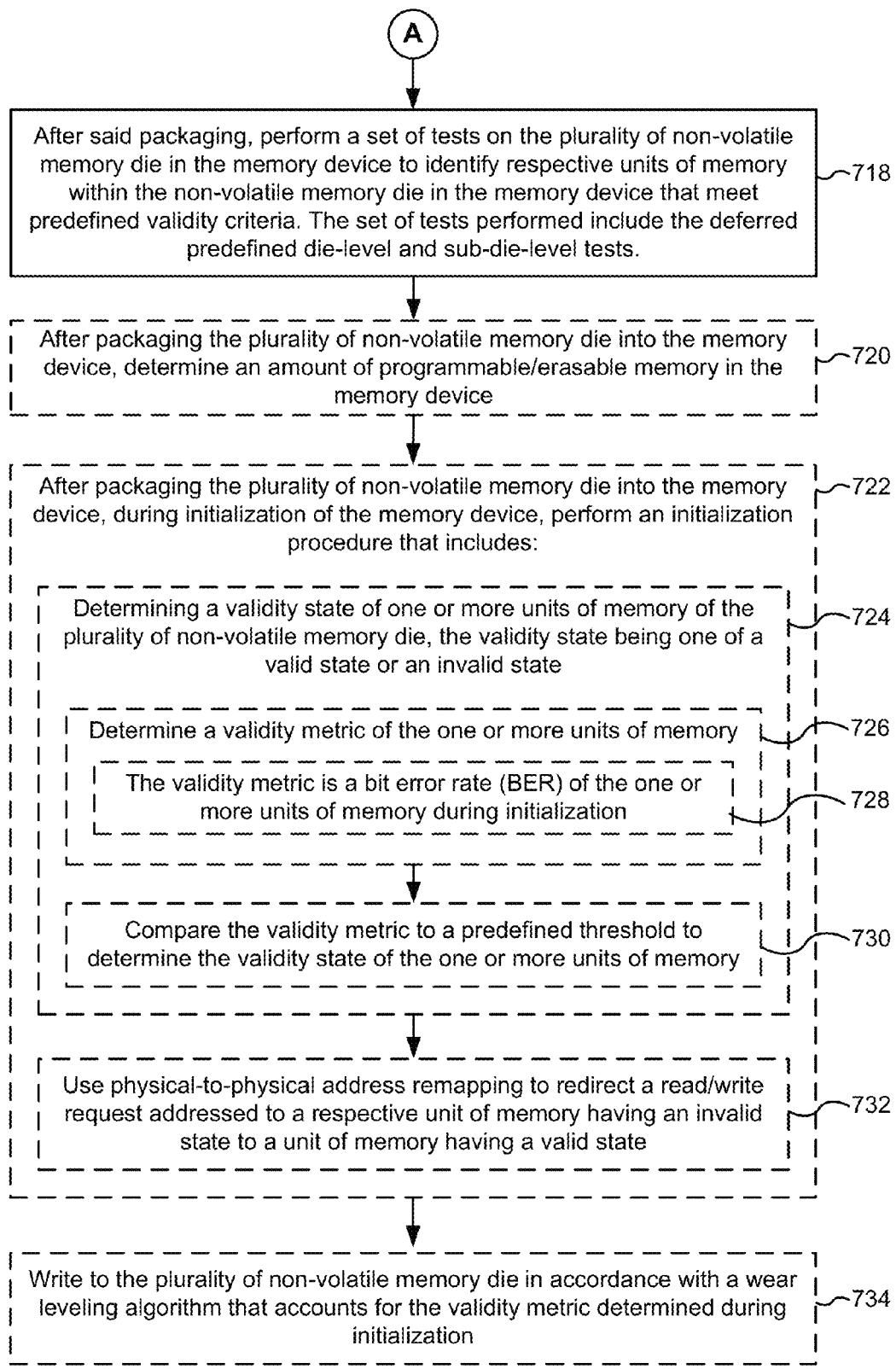

FIGS. 7A-7B illustrate a flowchart representation of method 700 for packaging non-volatile memory into a memory device, in accordance with some embodiments. Briefly, in some circumstances, method 700 is used to package low-test memory die (e.g., memory die upon which certain conventional tests have been deferred). Thus, method 700 is sometimes used to mitigate the costs of testing associated with production of high-grade memory devices. As used herein, the term "memory device" is used to mean any electronic device (e.g., a packaged device) that includes memory. For example, memory modules 102 (FIGS. 1A-1B) are considered memory devices. Data storage system 100 (FIGS. 1A-1B) is also an example of a memory device, as is a storage system having a storage controller (e.g., storage controller 120, FIGS. 1A-1B) and memory (e.g., NVM die 140/142, FIGS. 1A-1B).

Also, in some implementations, operations shown in separate figures (e.g., FIGS. 6A-6C) and/or discussed in association with separate methods (e.g., method 600) may be combined to form other methods, and operations shown in the same figure and/or discussed in association with the same method may be separated into different methods.

To that end, method 700 includes selecting (702), from a set of non-volatile memory die, a plurality of non-volatile memory (NVM) die (e.g., NVM die 140/142, FIG. 1B) on which predefined die-level and sub-die-level tests have been deferred until after packaging, in accordance with predefined criteria and predefined statistical die performance information corresponding to the set of non-volatile memory die. In some embodiments, method 700 includes deferring, or forgoing entirely, one or more wafer-level tests. For example, in some embodiments, method 700 includes deferring (704) at least until the selected plurality of non-volatile memory die are packaged into a memory device, or forgoing entirely, performance of at least one of the following tests: a wafer sort (WS) test (an example of a wafer-level tests), a memory component (MC) test (which is frequently an example of a sub-die-level test), a known good die (KGD) test (an example of a die-level test), and a burn-in test (which can be performed in a variety of configurations). In some circumstances, die-level tests include die sort (sometimes called electronic die sort) tests. In some circumstances, sub-die-level tests include circuit probe (CP) tests, which are conducted using a device called a wafer prober or, alternatively, a probe station. In some embodiments, method 700 includes deferring each test performed by a particular testing apparatus (e.g., a wafer prober).

As used herein, the term "burn-in test" is used to mean a process in which memory (e.g., in a memory die or memory device) are exercised prior to being placed in service (e.g., prior to being packaged and/or prior to use by a consumer). Burn-in tests are frequently performed because of the high initial failure rate for some memory devices (e.g., due to a so-called "bathtub curve," in which defective or severely compromised memory components fail early in their product lives). Performance of a burn-in test is intended to identify and/or remove the first-to-fail memory. In this sense, a memory die can be "removed" from production by forgoing its packaging into a memory device, or it can be removed from service within a memory device by removing its physical address(es) from a list of physical addresses assignable to logical addresses.

Unfortunately, certain types of memory are characterized by a finite lifetime that can be expressed, for example, as a number of viable program/erase (P/E) cycles after which the memory becomes unreliable (e.g., cannot be accurately written to and/or read from). For example, in some embodiments, the set of non-volatile memory die comprises (706) flash memory. As noted above, a flash memory cell (i.e., flash memory element) includes a transistor with a floating gate that is used to store a charge representative of a data value. Over time, repeatedly programming and erasing a flash memory cell will reduce the amount of charge stored by the floating gate, thus making it difficult to distinguish the data value held by the flash memory cell. Depending on the particular nature of the flash memory, flash memory cells can undergo, for example, 50, 100, 200, or 300 program/erase (P/E) cycles before becoming unreliable. The indiscriminate nature of burn-in tests can exhaust a substantial fraction of a memory components lifetime prior to the memory component being place in service. For example, some burn-in tests execute upward of 50 program/erase (P/E) cycles on each memory cell during testing.

In some embodiments, the flash memory die includes NAND-type flash memory or NOR-type flash memory. In other embodiments, the set of non-volatile memory die comprises one or more other types of non-volatile memory (e.g., resistive RAM (ReRAM)).

In some circumstances, reliability data from previous wafers subjected to the same processing is known. For example, as shown in FIG. 5, a fabrication process may lead to statistical differences in die reliability depending on a die's position on a wafer (e.g., radial position of the die with respect to the center of the wafer). Thus, in some embodiments, the selecting includes (708) selecting the plurality of non-volatile memory die in accordance with wafer positions (e.g., radial wafer positions) of the plurality of non-volatile memory die. More specifically, in some embodiments, the selecting includes (710) selecting the plurality of non-volatile memory die in accordance with wafer positions of the plurality of non-volatile memory die and statistical die performance information corresponding to the wafer positions.

To this end, in some embodiments, method 700 includes performing certain tests on a plurality of test wafers (e.g., a number of wafers such as 10, 100, or 1000 wafers) to determine (e.g., measure) the statistical die performance information corresponding to the wafer positions and established the predefined criteria used during selecting operation 702 (e.g., the tests are performed on the test wafers prior to execution of selecting operation 702). In some embodiments, the tests that are performed on the test wafers include the tests that are deferred until after packaging (see operation 702). In some embodiments, method 700 further comprises a commissioning process that includes performance of the tests on the plurality of test wafers.

Because many aspects of the semiconductor industry operate on a predefined development cycle (e.g., a two-year cycle such that a "next product generation" is expected every two years), capital equipment, including testing apparatus, often become obsolete quickly. One reason that testing apparatus become obsolete is insufficient throughput: that is to say, although a previous generations' testing apparatus may be able to perform tests with an adequate level of precision and accuracy, the testing apparatus will not be capable of operating at this precision and accuracy while offering an industrial-level of throughput. By performing such tests on test wafers rather than during device production, these tests can be given an abundance of time. Thus, concerns about throughput are mitigated. Stated another way, gathering of wafer, die, and/or sub-die information that would normally be obtained during production is shifted to a pre-production stage (e.g., during a commissioning stage of a production process), which allows the tests to be performed on a lower-throughput testing apparatus that does not need to be replaced as often.

In some embodiments, the selecting includes (712), in accordance with the predefined statistical die performance information, selecting a number of die so as to over-provision the memory device to guarantee, within a predefined statistical tolerance, a minimum amount of programmable/erasable memory in the memory device. For example, when the predefined statistical tolerance is 99.5% and the minimum amount of programmable erasable memory in the device is 10 gigabytes, in some embodiments, a number of die are selected such that at least 99.5% of the packaged memory devices (see operation 714) include at least 10 gigabytes of programmable/erasable memory. In some embodiments, the predefined statistical tolerance is expressible as a percentage of produced memory devices that include the minimum amount of programmable/erasable memory. For example, in various embodiments, the predefined statistical tolerance is 1-sigma (i.e., the percentage is about 68%), 2-sigma (i.e., the percentage is about 95%), or 3-sigma (i.e., the percentage is about 99.7%).

In some embodiments, the packaged memory devices are priced according to the predefined statistical tolerance. Thus, briefly, some embodiments of method 700 provide a manner in which extensive testing of memory devices is forgone in lieu of statistical testing performed on test wafers. To this end, in some embodiments, the high-grade memory devices are those devices that are over-provisioned such that the minimum amount of programmable/erasable memory is guaranteed to within a higher statistical tolerance than remnant-grade devices. Stated another way, memory devices are binned based on their level of over-provisioning rather than being binned via extensive testing.

For example, a high-grade 10 gigabyte memory device may be over-provisioned such as to provide a 99.5% guarantee of having 10 programmable/erasable gigabytes, while a remnant-grade 10 gigabyte memory device may only be over-provisioned such as to provide a 68% guarantee of having 10 programmable/erasable gigabytes. This can be achieved either by over-provisioning the high-grade memory devices to a greater extent (e.g., by adding one or more additional die to a high-grade memory device), as compared to remnant-grade memory devices, or alternatively, by selecting (for the high-grade memory devices) memory die having predefined statistical die performance information indicating more reliable performance (or a combination of these approaches). Although an example of a 10 gigabyte memory device has been used for the sake of explanation, it should be appreciated that method 700 is equally applicable on memory devices having more, or fewer, than 10 gigabytes. In some circumstances, method 700 is used for the production of enterprise storage memory devices, in which case the minimum level of programmable/erasable memory may be vastly greater than 10 gigabytes.

Method 700 further includes packaging (714) the selected plurality of non-volatile memory die into a memory device. In some embodiments, the selected plurality of non-volatile memory die is a plurality of flash memory die. In some embodiments, the plurality of flash memory die includes NAND-type flash memory and/or NOR-type flash memory. In other embodiments, the selected plurality of non-volatile memory die comprises one or more other types of non-volatile memory (e.g., resistive RAM (ReRAM)). In some embodiments, the selected plurality of non-volatile memory die is packaged into a memory module (e.g., NVM modules 102, FIGS. 1A-1B). In some embodiments, the selected plurality of non-volatile memory die is packaged into a memory device that includes a storage controller (e.g., the storage controller is arranged together with the plurality of physical die of non-volatile memory to form a memory device). As noted above, the term "memory device" is used to mean any electronic device (e.g., packaged device) that includes memory.

In some embodiments, a median number of program/erase (P/E) cycles performed on units of memory of the plurality of non-volatile memory die prior to the packaging is less than a predefined number. For example, in various embodiments, the units of memory (e.g., that the median number of program/erase (P/E) cycles is defined with respect to) are partial pages, word lines, pages, blocks, die planes, or die. In some embodiments, the units of memory are the minimum programmable unit of memory (e.g., often a page). In some embodiments, the units of memory are the minimum erasable units of memory (e.g., often a block). In some embodiments, the units of memory are addressable by a physical portion of a partial physical address (e.g., see description of method 600 for further details on partial physical addresses).

In some embodiments, a median number of program/erase (P/E) cycles performed on units of memory of the plurality of non-volatile memory die prior to the packaging is (716) less than fifty P/E cycles. But, in some embodiments, the median number of program/erase (P/E) cycles is zero, five or ten P/E cycles. Alternatively, in some embodiments, the median number of program/erase (P/E) cycles is 100 or any other integer number. Regardless, for the reasons discussed above, one goal of method 700, in some circumstances, is to limit the number of program/erase (P/E) cycles performed on the units of memory prior to the memory device being placed in service.

Method 700 further includes, after said packaging, performing (718) a set of tests on the plurality of non-volatile memory die in the memory device to identify respective units of memory within the non-volatile memory die in the memory device that meet predefined validity criteria. The set of tests performed include the deferred predefined die-level and sub-die-level tests. For the purposes of construction, the deferred predefined die-level and sub-die-level tests should be construed as those tests that are included in the set of tests performed on the plurality of non-volatile memory die in accordance with operation 718. For example, if a conventional process includes tests A, B, and C, and in accordance with method 700, none of A, B, and C is performed prior to packaging, and only A and B are performed after packaging in accordance with operation 718, the deferred tests should be considered A and B.

In some embodiments, method 700 includes, after packaging the plurality of non-volatile memory die into the memory device, determining (720) an amount of programmable/erasable memory in (sometimes called storage capacity of) the memory device. In some embodiments, determining an amount of programmable/erasable memory in the memory devices comprises writing test data to each unit of memory (or a plurality of units of memory) and writing said test data to a buffer (e.g., in DRAM), then reading the test data from each unit of memory and comparing it to the test data in the buffer. In some embodiments, a determination is made as to whether the comparison meets predefined reproducibility criteria for each unit of memory (or a plurality of units of memory). For example, in some circumstances, the predefined reproducibility criteria include that the test data read from a unit of memory is 100% recoverable, including by using error correcting code(s) and/or other data recovery methodologies. The amount of programmable/erasable memory data comprises the sum of the amount of programmable/erasable memory in each unit of memory that meets the predefined reproducibility criteria. In some embodiments, determining an amount of programmable/erasable memory in the memory device includes determining for each unit of memory (or a plurality of units of memory), a bit error rate (e.g., based on the number of bits corrected while decoding codewords from the unit of memory), and comparing the bit error rate (BER) to a predefined BER threshold. In some embodiments, in accordance with a determination that the bit error rate for a respective unit of memory is above the predefined BER threshold, method 700 includes discounting the unit of memory from the amount of programmable/erasable memory. And in some embodiments, in accordance with a determination that the bit error rate for a respective unit of memory is below the predefined BER threshold, method 700 includes the unit of memory in the amount of programmable/erasable memory.

In some embodiments, method 700 includes, after packaging the plurality of non-volatile memory die into the memory device, during initialization of the memory device, performing (724) an initialization procedure that includes: determining a validity state of one or more units of memory of the plurality of non-volatile memory die, the validity state being one of a valid state or an invalid state; and using (732) physical-to-physical address remapping to redirect a read/write request addressed to a respective unit of memory having an invalid state to a unit of memory having a valid state. In some embodiments, determining a validity state of one or more units of memory of the plurality of non-volatile memory die includes determining (726) a validity metric of the one or more units of memory and comparing (730) the validity metric to a predefined threshold (e.g., the predefined BER threshold, discussed above) to determine the validity state of the one or more units of memory. In some embodiments, the validity metric is (728) a bit error rate (BER) of the one or more units of memory during initialization. Each operation of operations 724-732 can have any of the properties, or include any of the procedures, and/or methodologies described with reference to method 600, which is, in some embodiments, a more detailed method of physical-to-physical address remapping.

In some embodiments, method 700 includes writing (734) to the plurality of non-volatile memory die in accordance with a wear leveling algorithm that accounts for the validity metric determined during initialization. For example, method 700 optionally includes writing to a respective unit of memory with a frequency that is inversely proportional to the respective unit of memory's bit error rate.

Figure 8A:
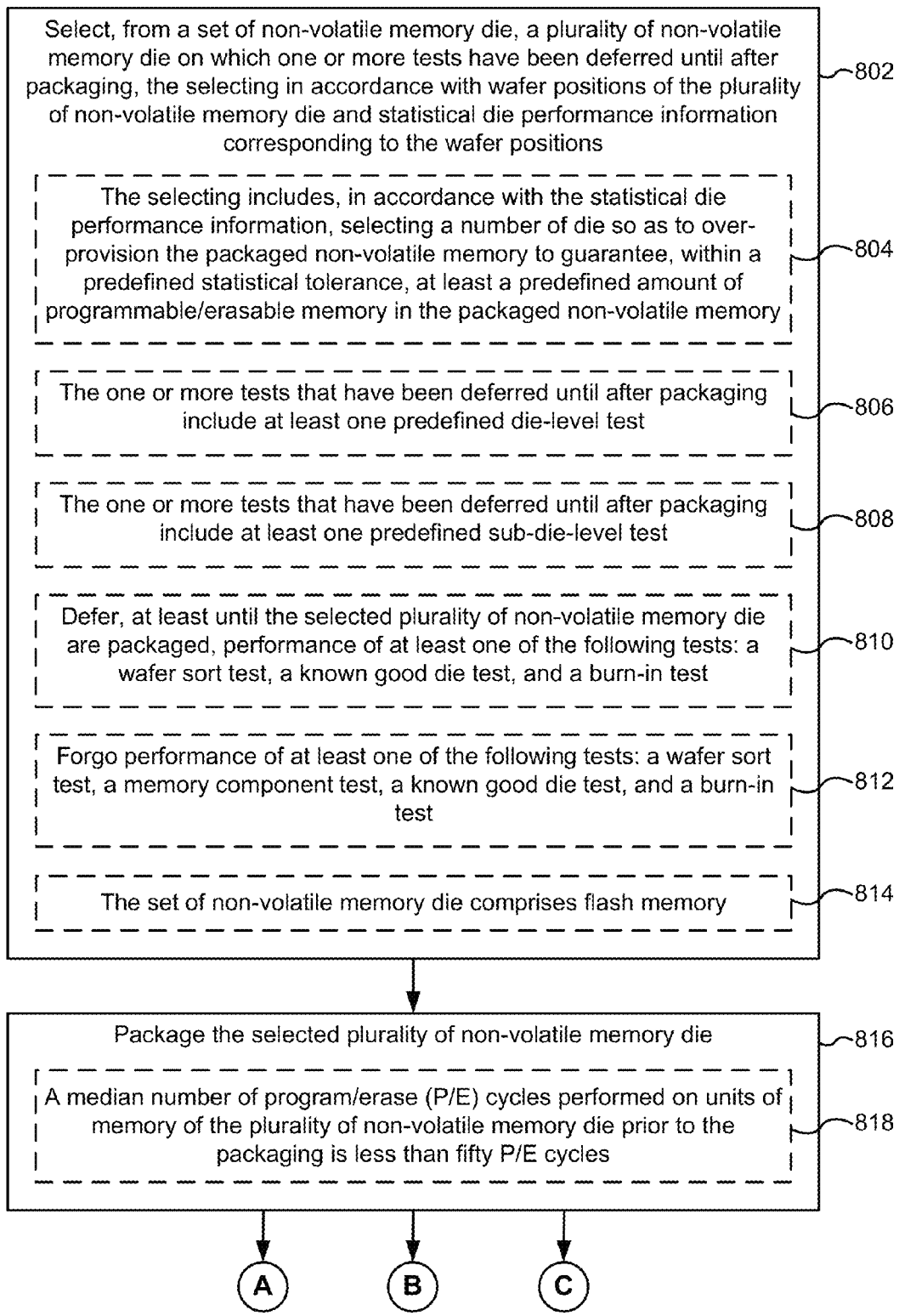
FIGS. 8A-8C illustrate a flowchart representation of a method for packaging non-volatile memory, in accordance with some embodiments.
Figure 8B:
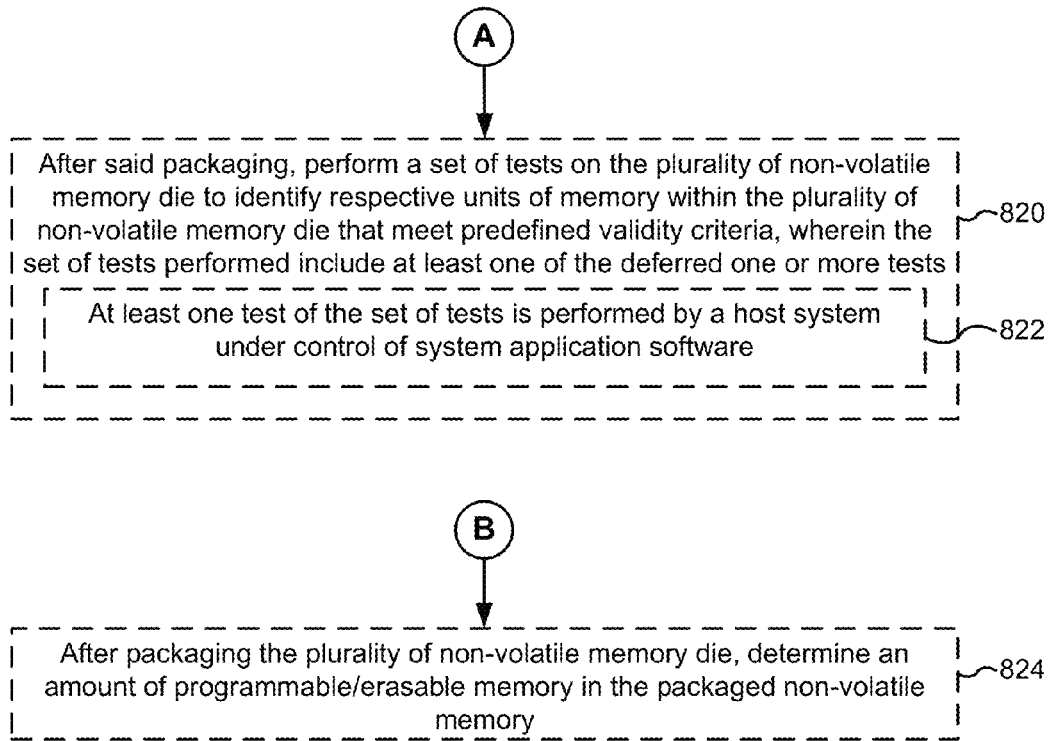
Figure 8C:
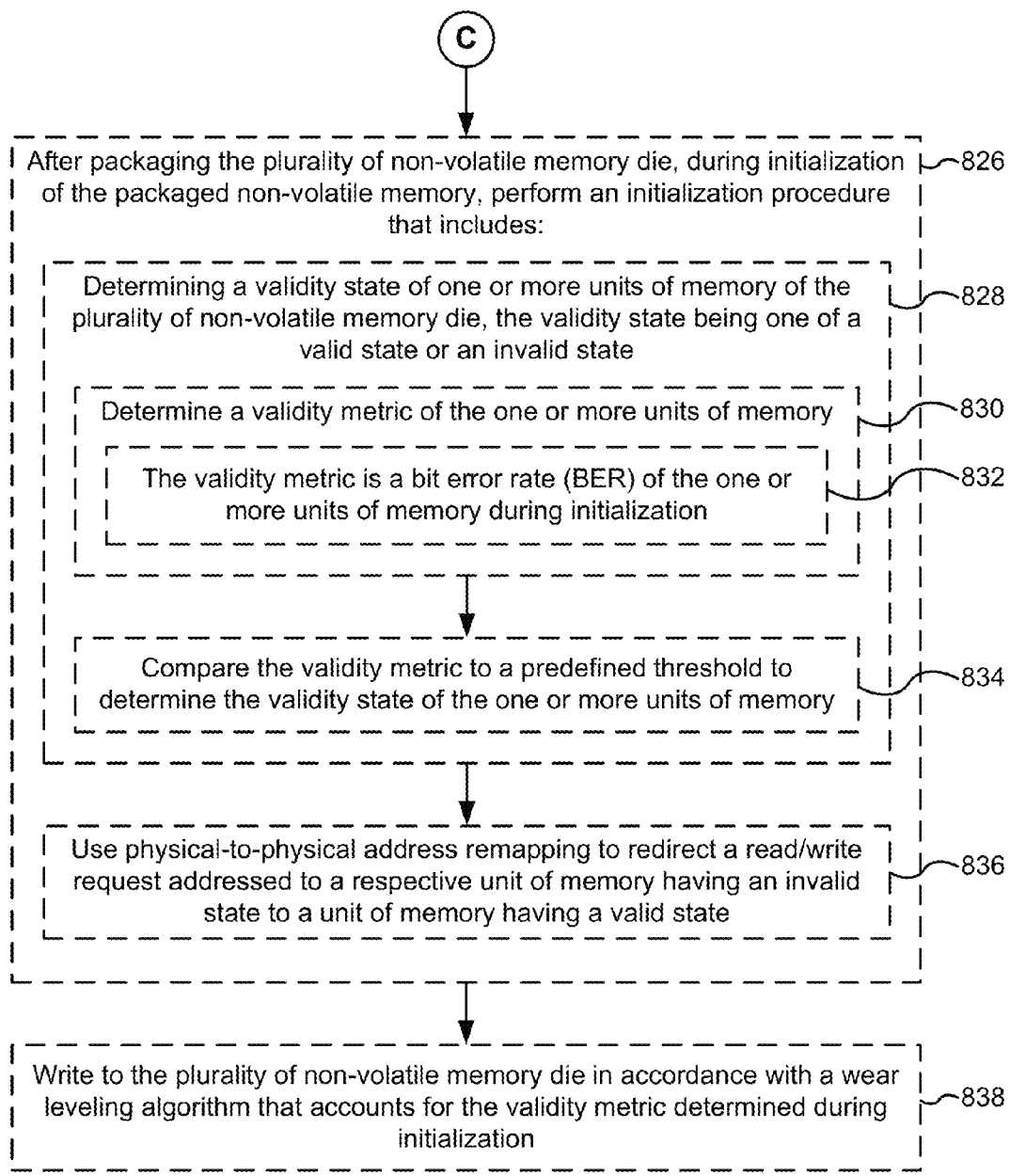

FIGS. 8A-8C illustrate a flowchart representation of method 800 for packaging non-volatile memory, in accordance with some embodiments. Briefly, in some circumstances, method 800 is used to package low-test memory die (e.g., memory die upon which certain conventional tests have been deferred). Thus, method 800 is sometimes used to mitigate the costs of testing associated with production of packaged non-volatile memory. As used herein, the term "packaged non-volatile memory" or simply "packaged memory" is used to mean any electronic device (e.g., a packaged device) that includes memory and/or a plurality of non-volatile memory die packaged together as a unit, with or without a housing (e.g., an array of non-volatile memory die mounted on a circuit board and packaged with a portion of epoxy covering the non-volatile memory die). For example, memory modules 102 (FIGS. 1A-1B) are considered packaged non-volatile memory. Data storage system 100 (FIGS. 1A-1B) is also an example of packaged non-volatile memory, as is a storage system having a storage controller (e.g., storage controller 120, FIGS. 1A-1B) and memory (e.g., NVM die 140/142, FIGS. 1A-1B).

Also, in some implementations, operations shown in separate figures (e.g., FIGS. 6A-6C and/or FIGS. 7A-7B) and/or discussed in association with separate methods (e.g., method 600 and/or method 700) may be combined to form other methods, and operations shown in the same figure and/or discussed in association with the same method may be separated into different methods.

To that end, method 800 includes selecting (802), from a set of non-volatile memory die, a plurality of non-volatile memory (NVM) die (e.g., NVM die 140/142, FIG. 1B) on which one or more tests have been deferred until after packaging, the selecting done in accordance with wafer positions of the plurality of non-volatile memory die and statistical die performance information corresponding to the wafer positions. In some circumstances, reliability data from previous wafers subjected to the same processing is known. For example, as shown in FIG. 5, a fabrication process may lead to statistical differences in die reliability depending on a die's position on a wafer (e.g., radial position of the die with respect to the center of the wafer, or die position with respect to a two-dimensional grid of die positions on the wafer(s)). Thus, in some embodiments, the selecting includes selecting the plurality of non-volatile memory die in accordance with wafer positions (e.g., radial wafer positions or die positions) of the plurality of non-volatile memory die. More specifically, in some embodiments, the selecting includes selecting the plurality of non-volatile memory die in accordance with wafer positions of the plurality of non-volatile memory die and statistical die performance information corresponding to the wafer positions.

To this end, in some embodiments, method 800 includes performing certain tests on a plurality of test wafers (e.g., a number of wafers such as 10, 100, or 1000 wafers) to determine (e.g., measure) the statistical die performance information corresponding to the wafer positions and establishing predefined criteria used during selecting operation 802 (e.g., the tests are performed on the test wafers prior to execution of selecting operation 802). In some embodiments, the tests that are performed on the test wafers include the one or more tests that are deferred until after packaging (see operation 802). In some embodiments, method 800 further comprises a commissioning process that includes performance of the tests on the plurality of test wafers.

In some embodiments, the selecting includes (804), in accordance with the statistical die performance information, selecting a number of die so as to over-provision the packaged non-volatile memory to guarantee, within a predefined statistical tolerance, at least a predefined amount of programmable/erasable memory in the packaged non-volatile memory. For example, when the predefined statistical tolerance is 99.5% and the predefined amount of programmable/erasable memory in the packaged non-volatile memory is 10 gigabytes, in some embodiments, a number of die are selected such that at least 99.5% of the packaged memory (e.g., packaged memory devices) (see operation 816) include at least 10 gigabytes of programmable/erasable memory. In some embodiments, the predefined statistical tolerance is expressible as a percentage of packaged memory (e.g., produced memory devices) that include the minimum amount of programmable/erasable memory. For example, in various embodiments, the predefined statistical tolerance is 1-sigma (i.e., the percentage is about 68%), 2-sigma (i.e., the percentage is about 95%), or 3-sigma (i.e., the percentage is about 99.7%). In some embodiments, the predefined amount of programmable/erasable memory is sometimes called the declared capacity.

In some embodiments, it is known that multiple instances of the packaged memory device will be included in a typical storage system. For example, in some embodiments, it may be know that at least N (e.g., 10, 100 or other number greater than 10) packaged memory devices will be included in each storage system. In such embodiments, the predefined statistical tolerance may be lower than in embodiments in which a relatively small number of packaged memory devices (e.g., 1, 2, 5, or other positive integer less than 10) may be used. Stated another way, in some embodiments, the selecting includes, in accordance with the statistical die performance information, selecting a number of die so as to over-provision the packaged non-volatile memory to guarantee, within a predefined statistical tolerance, at least a predefined amount of programmable/erasable memory, on average, in a set of N instances of the packaged non-volatile memory, where N is a positive integer greater than 1.

In some embodiments, packaged memory devices are priced according to the predefined statistical tolerance. Thus, briefly, some embodiments of method 800 provide a manner in which extensive testing of memory devices is forgone in lieu of statistical testing performed on test wafers. To this end, in some embodiments, the high-grade memory devices are those devices that are over-provisioned such that the minimum amount of programmable/erasable memory is guaranteed to within a higher statistical tolerance than remnant-grade devices. Stated another way, memory devices are binned based on their level of over-provisioning rather than being binned via extensive testing.

For example, a high-grade 10 gigabyte memory device may be over-provisioned such as to provide a 99.5% guarantee of having 10 programmable/erasable gigabytes, while a remnant-grade 10 gigabyte memory device may only be over-provisioned such as to provide a 68% guarantee of having 10 programmable/erasable gigabytes. This can be achieved either by over-provisioning the high-grade memory devices to a greater extent (e.g., by adding one or more additional die to a high-grade memory device), as compared to remnant-grade memory devices, or alternatively, by selecting (for the high-grade memory devices) memory die having predefined statistical die performance information indicating more reliable performance (or a combination of these approaches). Although an example of a 10 gigabyte memory device has been used for the sake of explanation, it should be appreciated that method 800 is equally applicable on memory devices (or other packaged memory) having more, or fewer, than 10 gigabytes. In some circumstances, method 800 is used for the production of enterprise storage memory devices, in which case the minimum level of programmable/erasable memory may be vastly greater than 10 gigabytes.

In some embodiments, the one or more tests that have been deferred until after packaging include (806) at least one predefined die-level test. For example, in some embodiments, the one or more tests that have been deferred until after packaging include at least one of the following die-level tests: a known good die (KGD) test (e.g., a quality assurance test performed at the die level to test for open and/or short circuits), a test to check word lines and/or bit lines of a die, a margin test, a die-level performance test, a uniformity test (e.g., to determine uniformity within the die, where typically, the more uniformity in the memory stack, the better), a test to determine the number of good blocks per die, a die sort (sometimes called electronic die sort) test, and a burn-in test (which can be performed in a variety of configurations). It is noted that some die-level tests are tests that are repeated at two or more temperatures, or that have distinct phases performed at two or more temperatures, and that some such die-level tests are used to determine or control trimming of one or more analog circuitry components. In some embodiments, analog component trimming of one or more on-die analog components is accomplished by setting configuration bits in non-volatile memory (of the die), where such configuration bits can only be accessed in a test mode or configuration mode of operation of the memory die, which is distinct from a normal mode of operation of the memory die. In some embodiments, such configuration bits are implemented using NOR flash, NAND flash, or programmable ROM (sometimes called field programmable ROM, or one-time programmable non-volatile memory). As explained above, in some embodiments, one or more of such die-level tests are deferred until after packaging.

In some embodiments, the one or more tests that have been deferred until after packaging include (808) at least one predefined sub-die-level test. For example, in some embodiments, the one or more tests that have been deferred until after packaging include at least one of the following sub-die-level tests: a memory component (MC) test (e.g., measurement of one or more AC components or timing parameters or DC components or parameters, and/or trimming of one or more analog components after such measurement(s)), and a burn-in test (which can be performed in a variety of configurations).

In some embodiments, method 800 includes deferring (810), at least until the selected plurality of non-volatile memory die are packaged, performance of at least one of the following tests: a wafer sort (WS) test (an example of a wafer-level tests), a known good die test (an example of a die-level test), and a burn-in test (which can be performed in a variety of configurations). In some embodiments, method 800 includes deferring each test performed by a particular testing apparatus (e.g., a wafer prober).

In some embodiments, method 800 includes forgoing (812) (e.g., forgoing entirely, such that the tests are neither performed before packaging nor performed after packaging) performance of at least one of the following tests: a wafer sort test (an example of a wafer-level tests), a memory component test, a circuit probe (CP) test, a known good die test (an example of a die-level test), and a burn-in test (which can be performed in a variety of configurations). In some embodiments, method 800 includes forgoing each test performed by a particular testing apparatus (e.g., a wafer prober).

As used herein, the term "burn-in test" is used to mean a process in which memory (e.g., in a memory die or memory device) are exercised prior to being placed in service (e.g., prior to being packaged and/or prior to use by a consumer). Burn-in tests are frequently performed because of the high initial failure rate for some memory devices (e.g., due to a so-called "bathtub curve," in which defective or severely compromised memory components fail early in their product lives). Performance of a burn-in test is intended to identify and/or remove the first-to-fail memory. In this sense, a memory die can be "removed" from production by forgoing its packaging into a memory device, or it can be removed from service within a memory device by removing its physical address(es) from a list of physical addresses assignable to logical addresses.

Unfortunately, certain types of memory are characterized by a finite lifetime that can be expressed, for example, as a number of viable program/erase (P/E) cycles after which the memory becomes unreliable (e.g., cannot be accurately written to and/or read from). For example, in some embodiments, the set of non-volatile memory die comprises (814) flash memory. As noted above, a flash memory cell (i.e., flash memory element) includes a transistor with a floating gate that is used to store a charge representative of a data value. Over time, repeatedly programming and erasing a flash memory cell will reduce the amount of charge stored by the floating gate, thus making it difficult to distinguish the data value held by the flash memory cell. Depending on the particular nature of the flash memory, flash memory cells can undergo, for example, 50, 100, 200, or 300 program/erase (P/E) cycles before becoming unreliable. The indiscriminate nature of burn-in tests can exhaust a substantial fraction of a memory components lifetime prior to the memory component being place in service. For example, some burn-in tests execute upward of 50 program/erase (P/E) cycles on each memory cell during testing.

In some embodiments, the flash memory die includes NAND-type flash memory or NOR-type flash memory. In other embodiments, the set of non-volatile memory die comprises one or more other types of non-volatile memory (e.g., resistive RAM (ReRAM)).

Method 800 further includes packaging (816) the selected plurality of non-volatile memory die. In some embodiments, the selected plurality of non-volatile memory die is a plurality of flash memory die. In some embodiments, the plurality of flash memory die includes NAND-type flash memory and/or NOR-type flash memory. In other embodiments, the selected plurality of non-volatile memory die comprises one or more other types of non-volatile memory (e.g., resistive RAM (ReRAM)). In some embodiments, the selected plurality of non-volatile memory die is packaged into a memory module (e.g., NVM modules 102, FIGS. 1A-1B). In some embodiments, the selected plurality of non-volatile memory die is packaged into a memory device that includes a storage controller (e.g., the storage controller is arranged together with the plurality of physical die of non-volatile memory to form a memory device). In some embodiments, the selected plurality of non-volatile memory die are packaged into a memory device. As noted above, the term "memory device" is used to mean any electronic device (e.g., packaged device) that includes memory. In some embodiments, the selected plurality of non-volatile memory die are packaged (e.g., with or without a physical housing) by being mounted on a circuit board (e.g., in an array forming a memory sub-system). In some of these embodiments, there is no package or housing surrounding the non-volatile memory die, but typically there is a portion of epoxy covering the non-volatile memory arrayed on the circuit board.

In some embodiments, a median number of program/erase (P/E) cycles performed on units of memory of the plurality of non-volatile memory die prior to the packaging is less than a predefined number. For example, in various embodiments, the units of memory (e.g., that the median number of program/erase (P/E) cycles is defined with respect to) are partial pages, word lines, pages, blocks, die planes, or die. In some embodiments, the units of memory are the minimum programmable unit of memory (e.g., a page). In some embodiments, the units of memory are the minimum erasable units of memory (e.g., a block). In some embodiments, the units of memory are addressable by a physical portion of a partial physical address (e.g., see description of method 600 for further details on partial physical addresses).

In some embodiments, a median number of program/erase (P/E) cycles performed on units of memory of the plurality of non-volatile memory die prior to the packaging is (818) less than fifty P/E cycles. But, in some embodiments, the median number of program/erase (P/E) cycles performed on units of memory of the plurality of non-volatile memory die prior to the packaging is zero, five or ten P/E cycles. Alternatively, in some embodiments, the median number of program/erase (P/E) cycles is 100 or any other integer number. Regardless, for the reasons discussed above, one goal of method 800, in some circumstances, is to limit the number of program/erase (P/E) cycles performed on the units of memory prior to the packaged memory being placed in service.

In some embodiments, method 800 includes, after said packaging, performing (820) a set of tests on the plurality of non-volatile memory die to identify respective units of memory within the plurality of non-volatile memory die that meet predefined validity criteria, wherein the set of tests performed include at least one of the deferred one or more tests. In some embodiments, the set of tests include tests for bad block mapping and/or tests to determine a storage density to be used in various memory portions (e.g., whether a given memory portion is to operate as SLC (single-level flash memory cell) (e.g., storing one bit of information per memory cell) or MLC (multi-level flash memory cell) (e.g., storing two or more bits of information per memory cell)). For the purposes of construction, the deferred one or more tests should be construed as those tests that are included in the set of tests performed on the plurality of non-volatile memory die in accordance with operation 820. For example, if a conventional process includes tests A, B, and C, and in accordance with method 800, none of A, B, and C is performed prior to packaging, and only A and B are performed after packaging in accordance with operation 820, the deferred tests should be considered A and B.

In some embodiments, at least one test of the set of tests is (822) performed by a host system (e.g., computer system 110, FIGS. 1A and 1B) under control of system application software. For example, in some embodiments, a host system (sometimes called a host, client, or client system) performs at least one test of the set of tests on the plurality of non-volatile memory die by running the system application software. In some embodiments, the system application software is either open source or closed source code.

In some embodiments, method 800 includes, after packaging the plurality of non-volatile memory die, determining (824) an amount of programmable/erasable memory in the packaged non-volatile memory. That amount is sometimes called the storage capacity of the packaged non-volatile memory, or the declared capacity of the packaged non-volatile memory. However, that amount sometimes corresponds to the sum (e.g., 10 gigabytes) of the declared capacity (e.g., 8 gigabytes) of the packaged non-volatile memory and the over-provisioning capacity (e.g., 2 gigabytes) of the packaged non-volatile memory. In some embodiments, determining an amount of programmable/erasable memory in the packaged non-volatile memory comprises writing test data to each unit of memory (or a plurality of units of memory) and writing said test data to a buffer (e.g., in DRAM), then reading the test data from each unit of memory and comparing it to the test data in the buffer. In some embodiments, a determination is made as to whether the comparison meets predefined reproducibility criteria for each unit of memory (or a plurality of units of memory). For example, in some circumstances, the predefined reproducibility criteria include that the test data read from a unit of memory is 100% recoverable, including by using error correcting code(s) and/or other data recovery methodologies. The amount of programmable/erasable memory data comprises the sum of the amount of programmable/erasable memory in each unit of memory that meets the predefined reproducibility criteria.

In some embodiments, determining an amount of programmable/erasable memory in the packaged non-volatile memory includes determining for each unit of memory (or a plurality of units of memory), a bit error rate (e.g., based on the number of bits corrected while decoding codewords from the unit of memory), and comparing the bit error rate (BER) to a predefined BER threshold. In some embodiments, in accordance with a determination that the bit error rate for a respective unit of memory is above the predefined BER threshold, method 800 includes discounting the unit of memory from the amount of programmable/erasable memory. And in some embodiments, in accordance with a determination that the bit error rate for a respective unit of memory is below the predefined BER threshold, method 800 includes the unit of memory in the amount of programmable/erasable memory. Thus, in some embodiments, some units of memory for which 100% of the test data was recoverable during post-packaging testing will nevertheless not be included in the determination of the amount of programmable/erasable memory because those units of memory had bit error rates in excess of the predefined BER threshold. For example, the error correction code used when storing data, including test data, in the plurality of non-volatile memory die may have the ability to correct up to N bits per page (e.g., 50 bits per page), but the BER threshold may be less than N bits per page (e.g., a BER threshold of 25 bits per page). Since BER rates are well known to increase over the life cycle of such products, having the BER threshold be lower than the error correction power of the error correction code "makes sense" from the perspective that the post-packaging testing is performed early in the life cycle of the packaged non-volatile memory.

In some embodiments, method 800 includes, after packaging the plurality of non-volatile memory die, during initialization of the packaged non-volatile memory, performing (826) an initialization procedure that includes: determining (828) a validity state of one or more units of memory of the plurality of non-volatile memory die, the validity state being one of a valid state or an invalid state; and using (836) physical-to-physical address remapping to redirect a read/write request addressed to a respective unit of memory having an invalid state to a unit of memory having a valid state. In some embodiments, determining (828) a validity state of one or more units of memory of the plurality of non-volatile memory die includes determining (830) a validity metric of the one or more units of memory and comparing (834) the validity metric to a predefined threshold (e.g., the predefined BER threshold, discussed above) to determine the validity state of the one or more units of memory. In some embodiments, the validity metric is (832) a bit error rate (BER) of the one or more units of memory during initialization. Each operation of operations 828-836 can have any of the properties, or include any of the procedures, and/or methodologies described with reference to method 600, which is, in some embodiments, a more detailed method of physical-to-physical address remapping.

In some embodiments, method 800 includes writing (838) to the plurality of non-volatile memory die in accordance with a wear leveling algorithm that accounts for the validity metric determined during initialization. For example, method 800 optionally includes writing to a respective unit of memory with a frequency that is inversely proportional to, or more generally corresponds to the inverse of, the respective unit of memory's bit error rate.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible (e.g., a NOR memory array). NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration (e.g., in an x-z plane), resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

The term "three-dimensional memory device" (or 3D memory device) is herein defined to mean a memory device having multiple memory layers or multiple levels (e.g., sometimes called multiple memory device levels) of memory elements, including any of the following: a memory device having a monolithic or non-monolithic 3D memory array, some non-limiting examples of which are described above; or two or more 2D and/or 3D memory devices, packaged together to form a stacked-chip memory device, some non-limiting examples of which are described above.

One of skill in the art will recognize that this invention is not limited to the two dimensional and three dimensional exemplary structures described but cover all relevant memory structures within the spirit and scope of the invention as described herein and as understood by one of skill in the art.

It will be understood that, although the terms "first," "second," etc. may be used herein to describe various elements, these elements should not be limited by these terms. These terms are only used to distinguish one element from another. For example, a first NVM controller could be termed a second NVM controller, and, similarly, a second NVM controller could be termed a first NVM controller, without changing the meaning of the description, so long as all occurrences of the "first NVM controller" are renamed consistently and all occurrences of the "second NVM controller" are renamed consistently. The first NVM controller and the second NVM controller are both NVM controllers, but they are not the same NVM controller.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A method for packaging non-volatile memory, comprising:
   selecting, from a set of non-volatile memory die, a plurality of non-volatile memory die on which one or more tests have been deferred until after packaging, the selecting in accordance with wafer positions of the plurality of non-volatile memory die and statistical die performance information corresponding to the wafer positions; and
   packaging the selected plurality of non-volatile memory die.

2. The method of claim 1, wherein the selecting includes:
   in accordance with the statistical die performance information, selecting a number of die so as to over-provision the packaged non-volatile memory to guarantee, within a predefined statistical tolerance, at least a predefined amount of programmable/erasable memory in the packaged non-volatile memory.

3. The method of claim 1, further including:
   after said packaging, performing a set of tests on the plurality of non-volatile memory die to identify respective units of memory within the plurality of non-volatile memory die that meet predefined validity criteria, wherein the set of tests performed include at least one of the deferred one or more tests.

4. The method of claim 3, wherein at least one test of the set of tests is performed by a host system under control of system application software.

5. The method of claim 1, wherein the one or more tests that have been deferred until after packaging include at least one predefined die-level test.

6. The method of claim 1, wherein the one or more tests that have been deferred until after packaging include at least one predefined sub-die-level test.

7. The method of claim 1, further including:
   deferring, at least until the selected plurality of non-volatile memory die are packaged, performance of at least one of the following tests: a wafer sort test, a known good die test, and a burn-in test.

8. The method of claim 1, further including:
   forgoing performance of at least one of the following tests: a wafer sort test, a memory component test, a known good die test, and a burn-in test.

9. The method of claim 1, further including:
   after packaging the plurality of non-volatile memory die, determining an amount of programmable/erasable memory in the packaged non-volatile memory.

10. The method of claim 1, further including:
    after packaging the plurality of non-volatile memory die, during initialization of the packaged non-volatile memory, performing an initialization procedure that includes:
       determining a validity state of one or more units of memory of the plurality of non-volatile memory die, the validity state being one of a valid state or an invalid state; and
       using physical-to-physical address remapping to redirect a read/write request addressed to a respective unit of memory having an invalid state to a unit of memory having a valid state.

11. The method of claim 10, wherein determining the validity state of the one or more units of memory includes:
    determining a validity metric of the one or more units of memory; and
    comparing the validity metric to a predefined threshold to determine the validity state of the one or more units of memory.

12. The method of claim 11, wherein the validity metric is a bit error rate (BER) of the one or more units of memory during initialization.

13. The method of claim 11, further including:
    writing to the plurality of non-volatile memory die in accordance with a wear leveling algorithm that accounts for the validity metric determined during initialization.

14. The method of claim 1, wherein the set of non-volatile memory die comprises flash memory.

15. The method of claim 1, wherein a median number of program/erase (P/E) cycles performed on units of memory of the plurality of non-volatile memory die prior to the packaging is less than fifty P/E cycles.

16. A storage system, comprising:
    an interface for operatively coupling the storage system with a host system; and
    a plurality of non-volatile memory die selected and packaged in accordance with the method of claim 1.

* * * * *